(12) United States Patent
Yanase et al.

(10) Patent No.: US 7,855,452 B2
(45) Date of Patent: Dec. 21, 2010

(54) SEMICONDUCTOR MODULE, METHOD OF MANUFACTURING SEMICONDUCTOR MODULE, AND MOBILE DEVICE

(75) Inventors: Yasuyuki Yanase, Gifu (JP); Yoshio Okayama, Gifu (JP); Kiyoshi Shibata, Gifu (JP); Yasunori Inoue, Ogaki (JP); Hideki Mizuhara, Ichinomiya (JP); Ryosuke Usui, Ichinomiya (JP); Tetsuya Yamamoto, Hashima (JP); Masurao Yoshii, Sano (JP)

(73) Assignee: Sanyo Electric Co., Ltd., Osaka (JP)

( * ) Notice: Subject to any disclaimer, the term of this patent is extended or adjusted under 35 U.S.C. 154(b) by 116 days.

(21) Appl. No.: 12/022,865

(22) Filed: Jan. 30, 2008

(65) Prior Publication Data
US 2008/0217769 A1 Sep. 11, 2008

(30) Foreign Application Priority Data
Jan. 31, 2007 (JP) ............... 2007-020540
Mar. 30, 2007 (JP) ............... 2007-090375
Jan. 23, 2008 (JP) ............... 2008-013191

(51) Int. Cl.
*H01L 23/48* (2006.01)
*H01L 29/40* (2006.01)
(52) U.S. Cl. ............ 257/737; 257/750; 257/774; 257/781; 257/785; 257/E23.02; 257/E23.068; 257/E23.07

(58) Field of Classification Search ............... 257/737, 257/750, 774, E23.02, E23.068, E23.07, 257/781, 785
See application file for complete search history.

(56) References Cited

U.S. PATENT DOCUMENTS

| 2002/0132461 A1* | 9/2002 | Kizaki | 438/612 |
| 2003/0102551 A1* | 6/2003 | Kikuchi | 257/701 |
| 2004/0140561 A1* | 7/2004 | Suzuki | 257/737 |

FOREIGN PATENT DOCUMENTS

JP 09-289264 11/1997

* cited by examiner

*Primary Examiner*—Long K Tran
(74) *Attorney, Agent, or Firm*—Fish & Richardson P.C.

(57) ABSTRACT

An electrode for a semiconductor device is formed on the mounting surface (particularly, the outer periphery thereof) of a semiconductor substrate in a semiconductor module. In order to secure a large gap between the electrodes, an insulating layer is formed on the electrode. Also formed are a plurality of bumps penetrating the insulating layer and connected to the electrode, and a rewiring pattern integrally formed with the bumps. The rewiring pattern includes a bump area and a wiring area extending contiguously with the bump area.

The insulating layer is formed to have a concave upper surface in an interval between the bumps, and the wiring area of the rewiring pattern is formed to fit that upper surface. The wiring area of the rewiring pattern is formed to be depressed toward the semiconductor substrate in relation to the bump area of the rewiring pattern.

3 Claims, 27 Drawing Sheets

SEMICONDUCTOR MODULE, METHOD OF MANUFACTURING SEMICONDUCTOR MODULE, AND MOBILE DEVICE

CROSS-REFERENCE TO RELATED APPLICATIONS

This application is based upon and claims the benefit of priority from the prior Japanese Patent Applications No. 2007-020540, filed Jan. 31, 2007, Japanese Patent Application No. 2007-090375, filed Mar. 30, 2007, and Japanese Patent Application No. 2008-013191, filed Jan. 23, 2008, the entire contents of which are incorporated herein by reference.

BACKGROUND OF THE INVENTION

1. Field of the Invention

The present invention relates to semiconductor modules, methods of manufacturing a semiconductor module, and mobile devices provided with the semiconductor module.

2. Description of the Related Art

Recently, with the trend toward miniaturization and high performance of electronic devices, there is a demand for reduction of the size of semiconductor modules used in electronic devices. To achieve this, narrow-gap electrodes for external connection of semiconductor components are essential. However, efforts for size reduction by narrowing the gap between electrodes have been successful only to a limited degree due to the constraints imposed by the size of solder balls and solder bridges produced. Recently, there are attempts to relocate the electrodes by routing lines (forming rewiring) in a semiconductor module in an effort to overcome the limitation. In one known method for relocation, a metal plate is half-etched so that a resultant bump (projection) is used as an electrode or a via, a semiconductor module is mounted on the metal plate via an insulating layer of, for example, epoxy resin, and the electrode for external connection of the semiconductor module is connected to the bump.

However, since copper (Cu) is generally used for a metal plate having a bump (and a wiring pattern in a semiconductor module having a bump), thermal stress is generated by the heat generated while the semiconductor module is in operation due to a difference in coefficient of thermal expansion between materials at an interface with the insulating layer. The thermal stress is concentrated in the bump projecting from and integral with a wiring pattern that extends parallel with the electrode of the semiconductor module. Therefore, disconnection may occur at an interface between the bump and the electrode. As efforts toward microfabrication of a bump itself are promoted for further miniaturization of a semiconductor module, the area of contact between the bump and the electrode will be reduced. Thus, there is a concern that disconnection may occur even more easily at an interface between the bump and the electrode due to the stress.

Since the metal plate (wiring pattern) and the insulating layer are adhesively attached to each other only at the contract surface, thermal stress may cause peeling so that reliability of the semiconductor module is lowered.

SUMMARY OF THE INVENTION

In this background, a general purpose of the present invention is to provide a technology to improve the reliability of connection in an electrode of a semiconductor module. Another purpose of the present invention is to provide a semiconductor module, a method of manufacturing the same, and a mobile device in which the likelihood of peeling of a wiring pattern from an insulating layer is reduced.

A semiconductor module according to at least one embodiment of the present invention comprises: a substrate having an electrode on a surface; an insulating layer provided on the substrate; a wiring layer provided on the insulating layer; and a bump provided with the wiring layer as one body and electrically connected to the electrode by penetrating the insulating layer, wherein the wiring layer has a first area in which the bump is provided, and a second area extending contiguously with the first area, and the second area of the wiring layer is formed to be depressed toward the substrate in relation to the first area.

According to this embodiment, the second area of the wiring layer is depressed toward the substrate so that, as the second area of the wiring layer is thermally expanded, with the bump located in the first area as an anchor point, due to the heat generated while the semiconductor module is in operation, a moment having a component parallel with the surface of the substrate and a downward, vertical component is generated in the second area of the wiring layer. Since the second area, in which such a moment is generated, is connected to the bump via the first area of the wiring layer, a moment commensurate with the moment in the second area of the wiring layer acts upon the bump. Thus, the moment (the downward, vertical component of the moment) that is generated when a thermal stress is generated in the semiconductor module reduces the stress applied to the bump in the direction of peeling (in the direction in which the bump is removed from the substrate). Therefore, the reliability (thermal reliability) of connection between the electrode and the bump in the semiconductor module is improved.

A method of manufacturing a semiconductor module, according to at least one embodiment of the present invention, comprises: preparing a semiconductor substrate having a plurality of electrodes on a surface; providing an isolation trench in a metal plate so as to form a bump projecting at a position corresponding to the electrode; pressure-bonding the metal plate and the semiconductor substrate via the insulating layer, electrically connecting the bump and the electrode by allowing the bump to penetrate the insulating layer, and bending the metal plate into a concave shape depressed toward the semiconductor substrate in an interval between the bumps; and patterning the wiring layer so as to form the wiring layer having a predetermined pattern.

By bending the metal plate into a concave shape depressed toward the semiconductor substrate between the bumps and then patterning the metal plate to form the wiring layer having a predetermined pattern, it is ensured that a moment having a parallel component parallel with the surface of the semiconductor substrate and a downward, vertical component is generated in the wiring layer, as the wiring layer is thermally expanded, with the bump as an anchor point, due to the heat generated while the semiconductor module is in operation. Since the wiring layer, in which such a moment is generated, is connected to the bump, a moment commensurate with the moment in the wiring layer acts upon the bump. Thus, it is possible to manufacture a semiconductor module in which the stress applied to the bump in the direction of peeling (in the direction in which the bump is removed from the semiconductor substrate) in the presence of thermal stress in the semiconductor module is reduced, and in which the reliability of connection between the electrode and the bump is improved.

In pressure-bonding the metal plate and the semiconductor substrate via the insulating layer, the metal plate can be bent into a concave shape without requiring any additional apparatuses. Therefore, the wiring layer, which is formed by patterning the metal plate, is easily formed into a concave shape, and a semiconductor module in which the stress, applied in the direction of peeling to the bump connected to the wiring layer, is reduced can be manufactured at a low cost.

A semiconductor module according to at least one embodiment of the present invention comprises: a substrate having on a major surface a first electrode electrically connected to a semiconductor device inside; an insulating layer provided on the substrate; a wiring layer provided on the insulating layer; a first conductor formed to be provided with the wiring layer as one body and penetrating the insulating layer so as to be in contact with the first electrode; and a second conductor projecting from the wiring layer into the insulating layer.

A method of manufacturing a semiconductor module, according to at least one embodiment of the present invention, comprises: preparing a substrate having on a major surface a first electrode electrically connected to a semiconductor device inside; preparing a conductor formed with a first conductor projecting at a position corresponding to the first electrode and with a second conductor projecting at a position different from the position of the first conductor; placing the substrate and the conductor so as to sandwich an insulating layer, bringing the first conductor into contact with the first electrode by pressure-bonding the conductor, and embedding the second conductor in the insulating layer; and patterning the conductor so as to form a wiring layer having a predetermined pattern.

A mobile device according to at least one embodiment of the present invention is provided with the semiconductor module as described above.

It is to be noted that any arbitrary combination or rearrangement of the above-described structural components and so forth are all effective as and encompassed by the present embodiments. Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

A description will be given, with reference to the drawings, of the embodiments embodying the present invention. In the figures, like numerals represent like constituting elements, and the description thereof is omitted as appropriate.

First Embodiment

Figure 1:
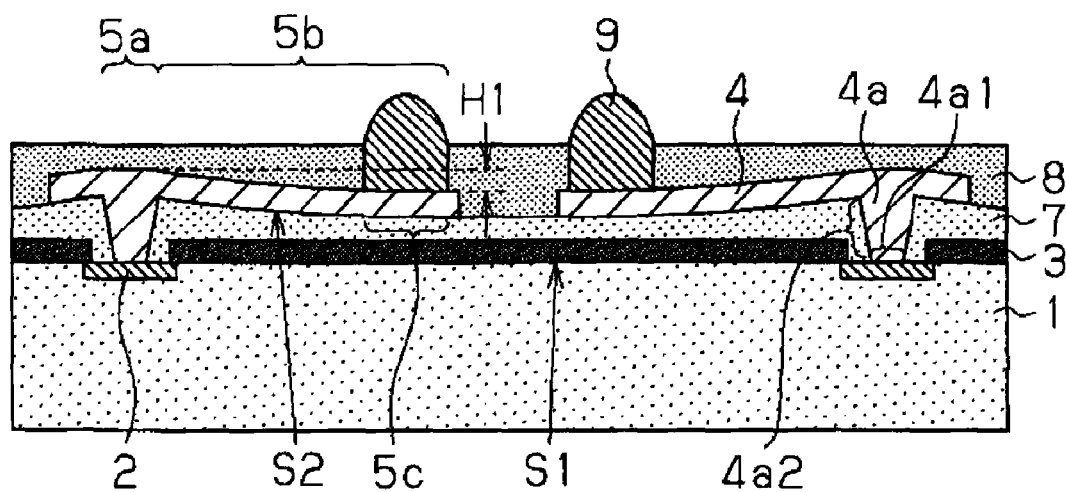
FIG. 1 is a schematic sectional view of a semiconductor module according to a first embodiment of the present invention.
Figure 2:
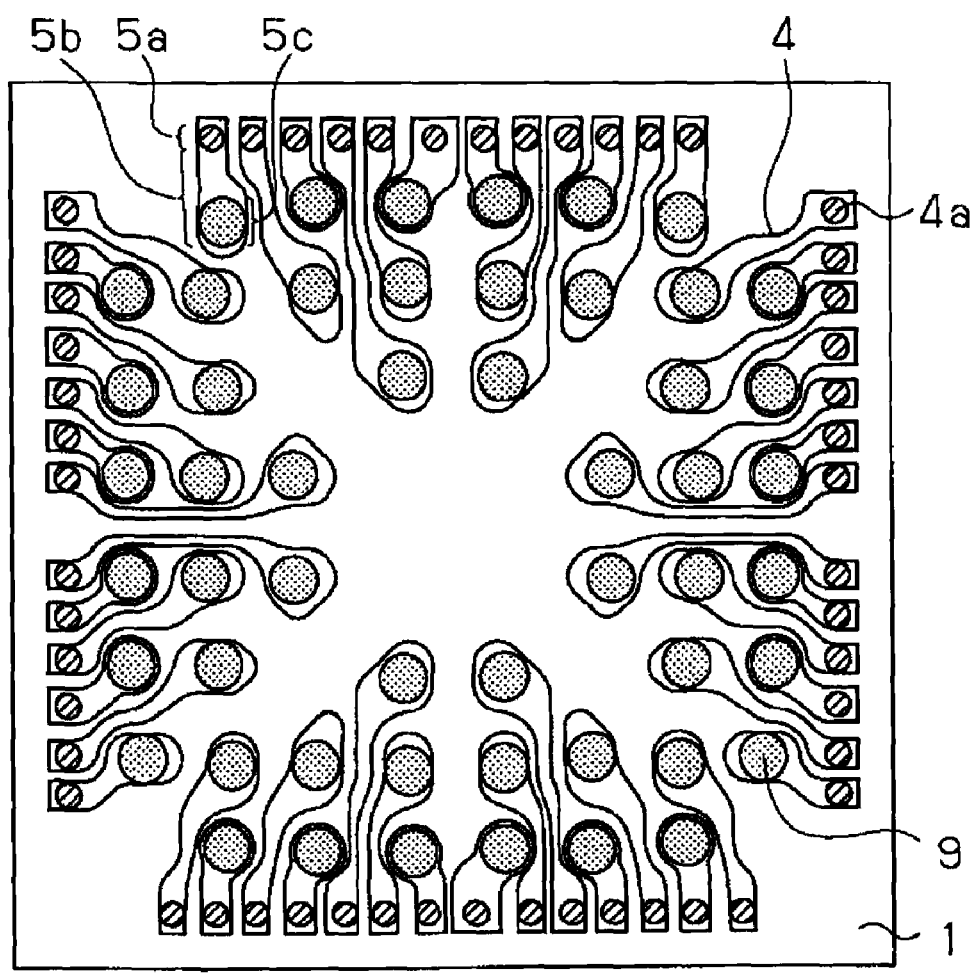
FIG. 2 is a top view of the surface of the semiconductor module of FIG. 1 on which an electrode for external connection is formed.

FIG. 1 is a sectional view of a semiconductor module according to a first embodiment, and FIG. 2 is a top view of the surface of the semiconductor module on which an electrode for external connection is formed.

A semiconductor substrate 1 in the semiconductor module according to the first embodiment is embodied by, for example, a p-type silicon wafer. A semiconductor device (not shown) such as an integrated circuit is formed on the upper surface S1 thereof (mounting surface) by using a well-known technology. An electrode 2 for the semiconductor device is formed on the surface S1 (particularly, the outer periphery thereof). A protective film 3 is formed on at least a part of the surface of the semiconductor substrate 1 so as to expose a certain area (center) of the electrode 2. In order to secure a large gap between the electrodes 2 on the semiconductor substrate 1, an insulating layer 7 is formed on the electrode 2 and the protective film 3. There are further provided a plurality of bumps 4a penetrating the insulating layer 7 and connected to the exposed surface of the electrode 2, and a rewiring pattern 4 formed on the surface S2 (bottom surface) so as to be provided with the bumps 4a as one body. The rewiring pattern 4 comprises a bump area 5a in which the bump 4a is provided and a wiring area 5b extending contiguously with the area 5a. The insulating layer 7 is formed to have a concave upper surface in the wiring area 5b, and the wiring area 5b of the rewiring pattern 4 is formed to fit that upper surface. The wiring area 5b of the rewiring pattern 4 is depressed toward the semiconductor substrate 1 in relation to the bump area 5a of the rewiring pattern 4. In certain areas (pad electrode areas 5c) of the rewiring pattern 4 opposite (upper surface) to the surface S2 are provided electrodes (solder balls) 9 for external connection. The areas of surface S2 of the pattern 4 other than the areas occupied by the electrodes are covered by a solder resist layer 8.

More specifically, the electrode 2 is formed so as to be connected to an integrated circuit constituting a semiconductor device. A large number of electrodes are formed at the outer periphery of the integrated circuit. The electrode 2 is formed of aluminum (Al), copper (Cu), or the like. In case the electrode 2 is formed of aluminum, a barrier film of titanium nitride (TiN) or tantalum nitride (TaN) may be formed on the surface of the electrode 2. By forming a barrier film on the surface of the electrode 2, copper (material for forming the bump 4a) is prevented from being diffused to the electrode 2 as the bump 4a comes into contact with the electrode 2. By forming the electrode 2 of copper, the electrode 2 and the bump 4a will have the same coefficient of thermal expansion so that the connection reliability (thermal reliability) at the interface in the presence of thermal stress is improved. Further, the end of the bump may be formed into a small, rugged pattern. With this, the bump is securely bonded to the electrode by press working so that the connection reliability is improved accordingly. Alternatively, the reliability of connection with the electrode may be improved by plating the end of the bump with gold (Au)/nickel (Ni).

The insulating layer 7 is formed on the semiconductor substrate 1 so as to have a concave upper surface such that the thickness of the layer 7 is progressively smaller toward the center between the bumps 4a, and away from the bump 4a. The amount of depression H1 of the insulating layer 7 in an interval between the bumps 4a is about 25 µm. The insulating layer 7 is formed of a material that undergoes plastic flow when applied pressure. Illustrative examples of a material that undergoes plastic flow when applied pressure include epoxy thermosetting resin. The resin may be a material exhibiting the viscosity of 1 kPa*s at the temperature of 160° C. and the pressure of 8 MPa. If the material is pressured at 15 MPa under the temperature of 160° C., the viscosity of the resin will drop to ⅛ the level exhibited when the resin is not pressured.

The rewiring pattern 4 is formed on the insulating layer 7 and comprises a bump area 5a and a wiring area 5b extending contiguously with the area 5a. A plurality of bumps 4a each integral with the bump area 5a of the rewiring pattern 4 are provided at the positions corresponding to the electrodes 2. The bump projects through the surface S2 and penetrates the insulating layer 7. As shown in FIG. 2, the bumps 4a are placed at the outer periphery of the semiconductor substrate 1. Further, as shown in FIG. 1, the rewiring pattern 4 is formed such that the wiring area 5b thereof is formed to fit the upper surface of the insulating layer 7 and is depressed toward the semiconductor substrate 1 in relation to the bump area 5a of the rewiring pattern 4. The amount of depression H1 of the rewiring pattern 4 is about 25 µm, which is the same as the amount of depression of the insulating layer. For example, a rolled metal comprising rolled copper may be used to form the rewiring layer 40 and the bump 4a. As compared with a metal film comprising copper and formed by, for example, plating, a rolled metal comprising copper excels in mechanical strength and is suitable as a material for rewiring. The rewiring pattern 4 has a thickness of about 20 µm, and the bump 4a has a height (thickness) of about 35 µm. The bump 4a is formed as a truncated cone. More specifically, the bump 4a is provided with an end part 4a1 parallel with the contact surface of the electrode 2 of the semiconductor substrate 1, and with a side part 4a2 formed to be progressively smaller in diameter (dimension) toward the end part 4a1. The bump 4a has a trapezoidal cross section, as a result of the end of a cone being removed. The diameter of the bump 4a at the end (end part 4a1) and the diameter at the base (surface in contact with the electrode 2) are about 30 µmϕ and 40 µmϕ, respectively. The bump 4a is positioned to correspond to the electrode 2.

The end (end part 4a1) of the bump 4a is formed so as to be in direct contact with the electrode 2 of the semiconductor substrate 1. The end electrically connects the electrode 2 with the rewiring pattern 4 via the bump 4a.

The electrode (solder ball) 9 for external connection is provided in a certain area (pad electrode area 5c) of the rewiring pattern 4 opposite (upper surface) to the surface S2. The electrode 9 functions as a terminal for external connection for the electrode 2. As shown in FIG. 2, the electrode 9 is located inside an area surrounded by the bumps 4a provided at the outer periphery of the semiconductor substrate 1. The electrode 9 is electrically connected to the bump 4a (the bump area 5a of the rewiring pattern 4) via the wiring area 5b (including the pad electrode area 5c) of the rewiring pattern 4. As shown in FIG. 1, the areas other than the pad electrode area 5c are covered by the solder resist layer 8, which functions as a protective layer for the rewiring pattern 4.

The semiconductor substrate 1 is an example of the "substrate" according to the invention, the electrode 2 is an example of the "electrode" according to the invention, the insulating layer 7 is an example of the "insulating layer" according to the invention, the rewiring pattern 4 is an example of the "wiring layer" according to the invention, the bump 4a is an example of the "bump" according to the invention, the bump area 5a is an example of the "first area" according to the invention, and the wiring area 5b is an example of the "second area" according to the invention.

(Manufacturing Method)

Figure 3A:
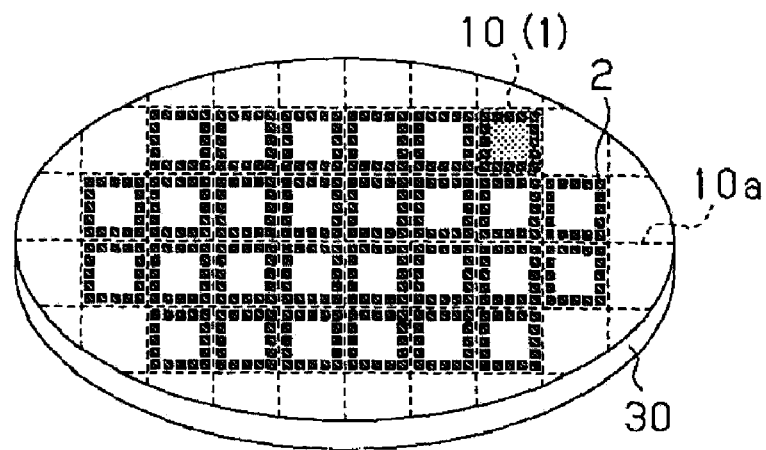
FIG. 3A is a perspective view of a semiconductor wafer.
Figure 3B:
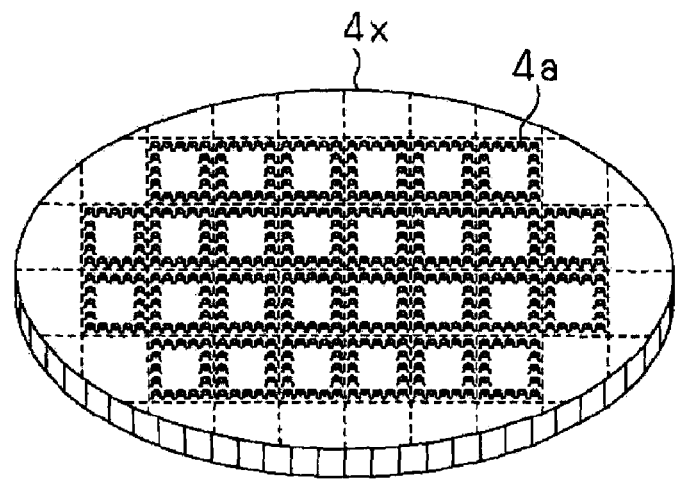
FIG. 3B is a perspective view of a metal plate having bumps adapted to the semiconductor wafer.
Figure 3C:
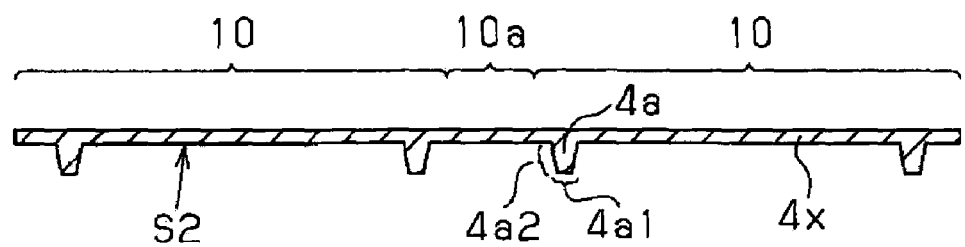
FIG. 3C is a sectional view of the metal plate having bumps.

FIG. 3A is a perspective view of a semiconductor wafer, which is an example of the semiconductor substrate (the exemplification is used throughout the specification). FIG. 3B is a perspective view of a metal plate having bumps and formed on the semiconductor wafer, and FIG. 3C is a sectional view of the metal plate having bumps.

Firstly, a semiconductor wafer 30, which is an example of the semiconductor substrate, is prepared in which is formed a matrix of semiconductor module areas 10 (semiconductor substrate 1) defined by a plurality of scribe lines 10a. As shown in FIG. 3A, a semiconductor device such as an integrated circuit is formed in each of the semiconductor module areas 10. The electrodes 2 connected to the semiconductor device are formed at the outer periphery of the device. The semiconductor wafer 30 as described is produced by a semiconductor manufacturing process involving a combination of related-art lithographic technology, etching technology, ion implantation technology, film deposition technology, thermal process technology, and the like.

A copper plate 4x (metal plate having bumps) provided with bumps 4a as one body is prepared. As shown in FIG. 3B, the size of the copper plate 4x in a top view is about the same as that of the semiconductor wafer 30. The bumps 4a are provided on the surface S2 of the copper plate 4x at the positions corresponding to the respective electrodes 2 in each of the semiconductor module areas 10. As shown in FIG. 3C, the bump 4a is provided with an end part 4a1 parallel with the contact surface of the electrode 2 of the semiconductor substrate 1, and with a side part 4a2 formed to be progressively smaller in diameter.

A description will be given of a method of forming a metal plate having bumps (a copper plate 4x provided with the bumps 4a as one body). FIG. 4 is a sectional view showing how a metal plate of FIG. 3C having bumps is formed.

Figure 4A:
FIGS. 4A-4E are sectional views showing how a metal plate having bumps is formed according to the first embodiment.

As shown in FIG. 4A, a copper plate 4z thicker than the sum of the height of the bump 4a and the thickness of the rewiring pattern 4 is prepared. It will be assumed here that the thickness of the copper plate 4z is about 100 μm. A rolled metal comprising rolled copper is used to form the copper plate 4z.

Figure 4B:
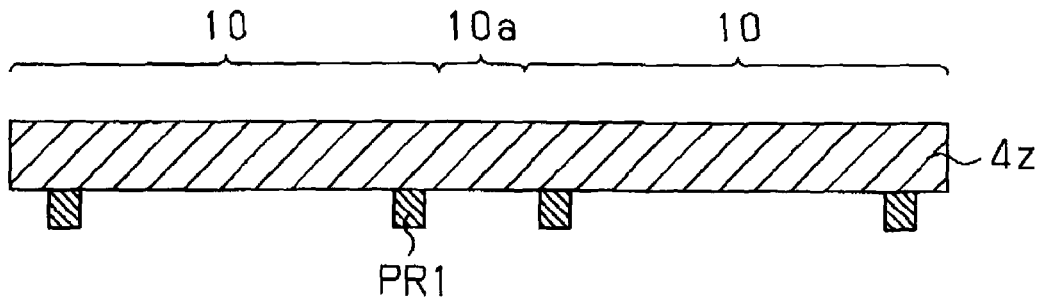

As shown in FIG. 4B, lithographic steps are used to form resist masks PR1 in areas for bumps within each of the semiconductor module areas 10. The areas for bumps are arranged to correspond to the positions of the electrodes 2 of the semiconductor substrate 1 in the semiconductor wafer 30, which is partitioned by the plurality of scribe lines 10a into the plurality of semiconductor module areas 10. A resist protective film (not shown) is formed on the entirety of the surface (upper surface) opposite to the surface in which the resist masks PR1 are provided, so as to protect the copper plate 4z.

Figure 4C:
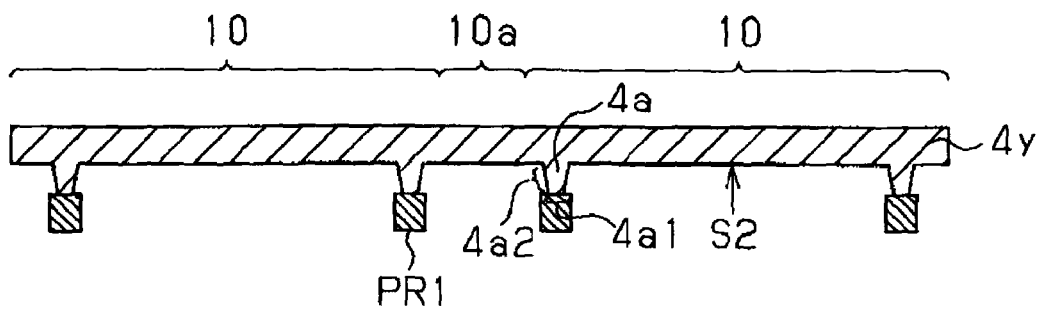

As shown in FIG. 4C, the bump 4a having a predetermined truncated cone pattern and projecting above the surface S2 of the copper plate 4z is formed by performing wet etching using a chemical solution such as a ferric chloride solution, using the resist mask PR1 as a mask, so as to form an isolation trench on the surface of a copper plate 4y. In this process, the bump 4a is formed to have a tapered side part 4a2 which is progressively smaller in diameter (dimension) toward the end part 4a1. The height of the bump 4a is about 35 μm. The diameter of the bump 4a at the end (end part 4a1) and the diameter at the base are about 30 μmϕ and 40 μmϕ, respectively.

Figure 4D:
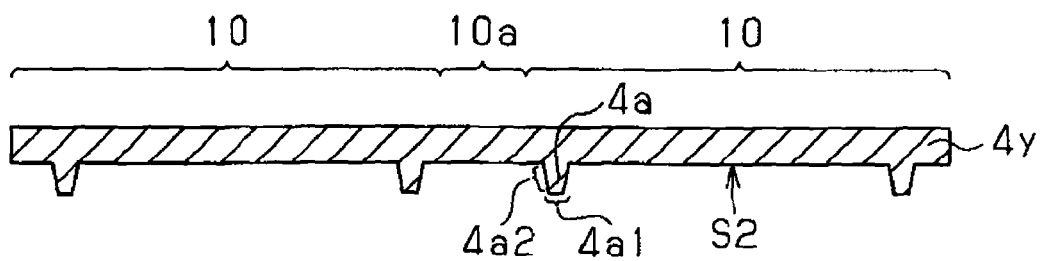

As shown in FIG. 4D, the resist mask PR1 and the resist protective film are removed. With this, the bumps 4a are integrally formed on the surface S2 of a copper plate 4y. A metal mask such as a silver (Ag) mask may be used in place of the resist mask PR1. With this, satisfactory etching selectivity ratio between the mask and the copper plate 4z is ensured so that the bumps 4a can be even finely patterned.

Figure 4E:
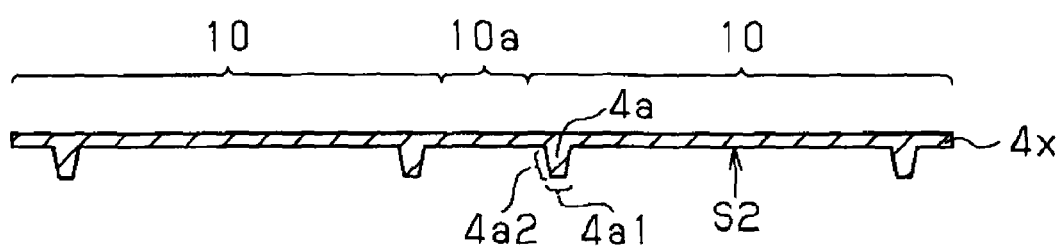

As shown in FIG. 4E, the thickness of the copper plate 4y is reduced by, for example, wet etching the entirety of the copper plate 4y from the side opposite to the surface S2, using a chemical solution such as a ferric chloride solution. In this process, the resist protective film (not shown) is formed on the surface S2 so as to protect the bumps 4a and the copper plate 4y. The resist protective film is removed after the etching process. In this way, a copper plate 4x, worked to a desired thickness (the thickness of the rewiring pattern 4) and having the bumps 4a integrally formed thereon (S2), is formed. The thickness of the copper plate 4x according to the embodiment is about 20 μm. The copper plate 4x is an example of the "metal plate" according to the invention.

The copper plate 4x having the bumps 4a and thus manufactured is used in the process described below of manufacturing the semiconductor module according to the first embodiment. FIGS. 5A through 6C are sectional views showing the process of manufacturing the semiconductor module according to the first embodiment.

Figure 5A:
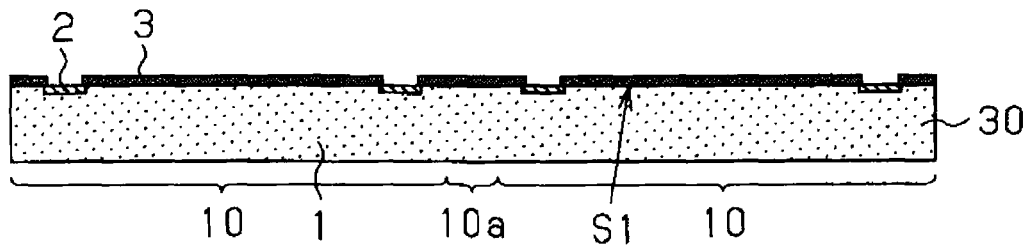
FIGS. 5A-5D are sectional views showing the process of manufacturing the semiconductor module according to the first embodiment.

As shown in FIG. 5A, the semiconductor wafer 30 is prepared on the surface (upper surface) S1 of which is provided the semiconductor module areas 10 having the electrode 2 and the protective film 3. More specifically, a well-known technology is used to form a semiconductor device such as an integrated circuit on the surface S1 of each of the semiconductor module areas 10 in the semiconductor wafer 30 (semiconductor substrate) embodied by, for example, a p-type silicon substrate, and to form the electrode 2 at the outer periphery of the device. A metal such as aluminum is used to form the electrode 2. An insulating protective film 3 for protecting the semiconductor substrate 1 is formed on the surface S1 of the semiconductor substrate 1 outside the electrodes 2. The protective film 3 may be a silicon oxide ($SiO_2$) film, a silicon nitride (SiN) film, or a polyimide (PI) film. The semiconductor wafer 30 is an example of the "semiconductor wafer" according to the invention.

Figure 5B:
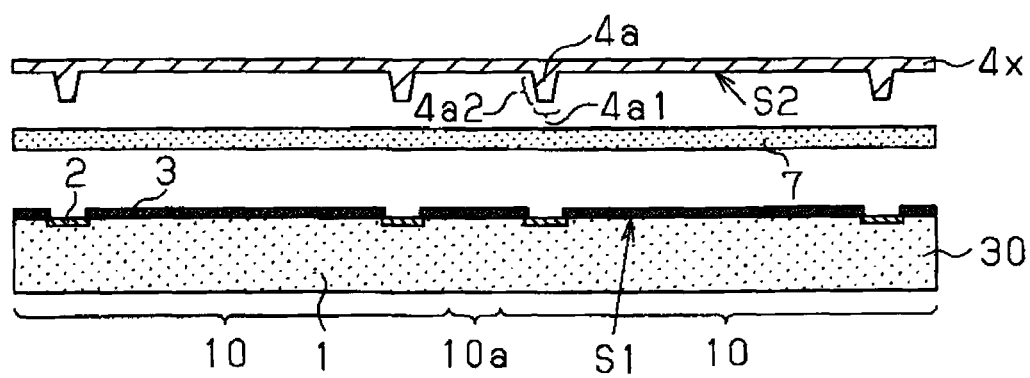

As shown in FIG. 5B, the semiconductor wafer 30 and the copper plate 4x provided with the bumps 4a as one body are placed so as to sandwich the insulating layer 7 on the surface S1 of the semiconductor wafer 30. The thickness of the insulating layer 7 is about 35 μm, which is substantially equal to the height of the bump 4a. The copper plate 4x having the bumps 4a is formed as described above.

Figure 5C:
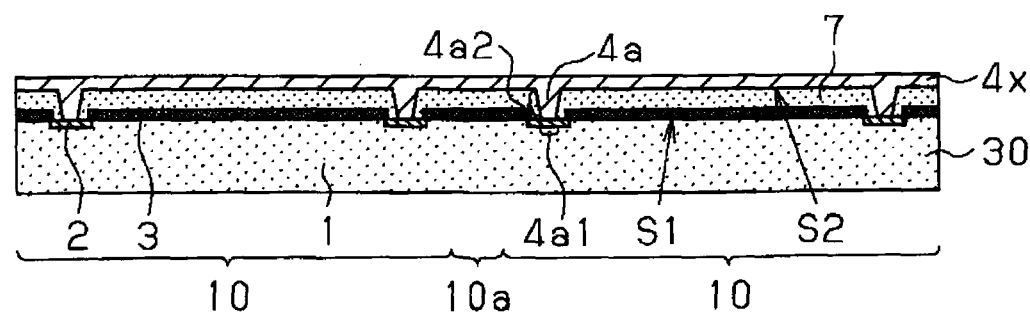

As shown in FIG. 5C, the semiconductor wafer 30, the insulating layer 7, and the copper plate 4x are integrated by pressure-molding the sandwiched assembly as described above by a press machine. The pressure and the temperature of the press work are about 5 MPa and 200° C., respectively. The press work lowers the viscosity of the insulating layer 7 so that the insulating layer 7 undergoes plastic flow. This allows the bump 4a to penetrate the insulating layer 7 so that the bump 4a and the electrode 2 are electrically connected. Since the bump 4a has the side part 4a2 formed to be progressively smaller in diameter toward the end part 4a1, the bump 4a penetrates the insulating layer 7 smoothly. As a result, the insulating layer 7 is effectively drained out from the interface between the bump 4a and the electrode 2, preventing a portion of the insulating layer 7 from remaining as the residue.

Figure 5D:
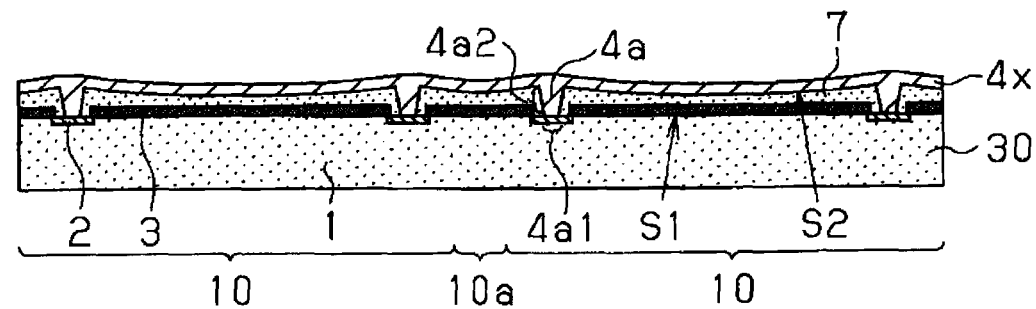

As shown in FIG. 5D, by cooling the press-bonded assembly comprising the copper plate 4x and the insulating layer 7 for film shrinkage, the copper plate 4x is bent into a concave shape, anchored by the bumps 4a, with the result that the insulating layer 7 in an interval between the bumps 4a has a concave upper surface which is progressively thinner toward the center thereof away from the bumps 4a. Thus, the copper plate 4x is bent into a concave shape depressed toward the semiconductor wafer 30, fitting the surface of the insulating layer 7, and is finished such that the upper surface of the copper plate 4x in the wiring area 5b is depressed in relation to the upper surface of the copper plate 4x in the bump area 5a. The amount of depression H1 of the copper plate 4x in an interval between the bumps 4a (part corresponding to the pad electrode area 5c) is about 25 μm. Before cooling the layer 7, resin is completely hardened to ensure that the bump providing the anchor support does not move. This can be achieved by, for example, heating and pressure-bonding the assembly comprising the layer 7 and the plate 4x at 240° C. and for two hours, and by keeping applying pressure to the assembly while the assembly is being cooled to room temperature.

Figure 6A:
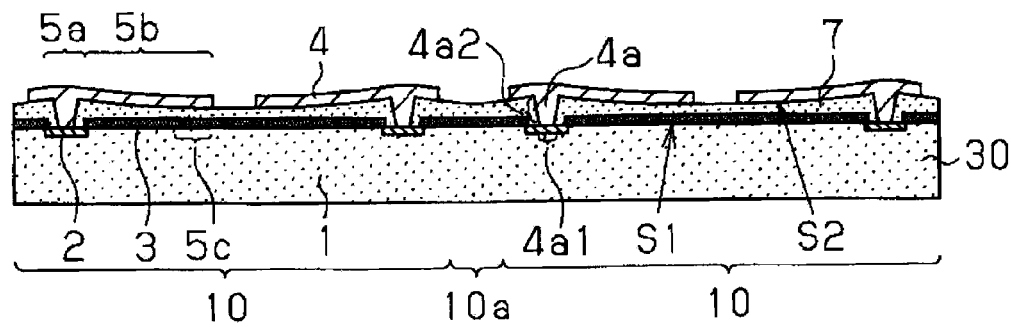
FIGS. 6A-6C are sectional views showing the process of manufacturing the semiconductor module according to the first embodiment.

As shown in FIG. 6A, lithography and etching are used to work the copper plate 4x into the rewiring pattern 4. The rewiring pattern 4 comprises the bump area 5a in which the bump 4a is provided and the wiring area 5b extending contiguously with the area 5a. The wiring area 5b of the rewiring pattern 4 is finished such that the area 5b is depressed toward the semiconductor wafer 30 in relation to the bump area 5a of the rewiring pattern 4, reflecting the concave shape of the upper shape of the copper plate 4x.

Figure 6B:
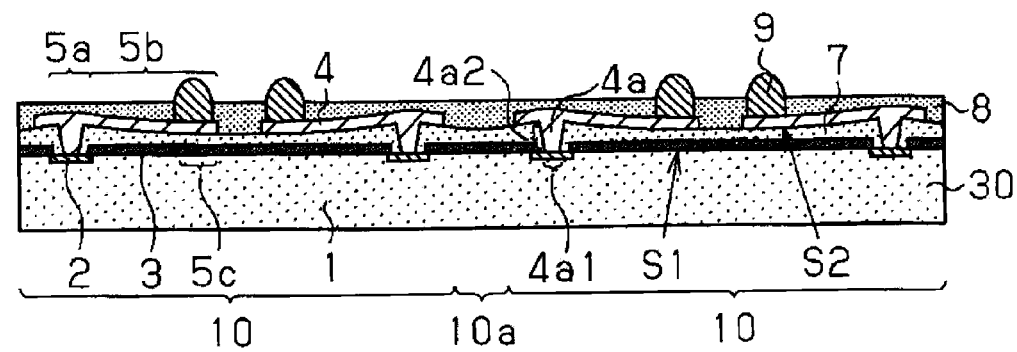

As shown in FIG. 6B, the solder resist layer 8 is formed so as to have an opening in the pad electrode area 5c of the rewiring pattern 4 and to cover the insulating layer 7 and the rewiring pattern 4. The solder resist layer 8 functions as a protective film for the rewiring pattern 4. The solder resist layer 8 comprises, for example, epoxy resin and has a thickness of about 40 μm. Solder printing is used to form an electrode for external connection (solder ball) 9 which functions as a terminal for the pad electrode area 5c of the rewiring pattern 4. More specifically, the electrode 9 is formed by printing solder paste (paste mixture of resin and solder) onto a desired location using a screen mask and heating the paste to a solder melting temperature.

Figure 6C:
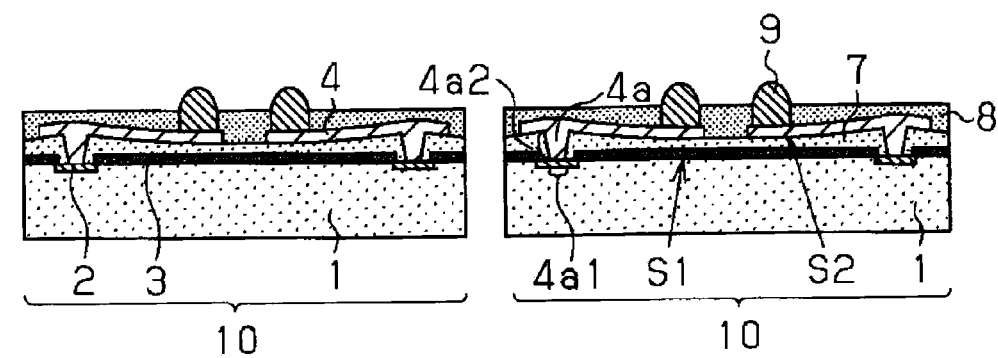

As shown in FIG. 6C, individual semiconductor modules are produced by dicing the semiconductor wafer 30 from beneath (underside) the wafer 30 along scribe lines 10a which define the plurality of semiconductor module areas 10 (semiconductor substrate 1). Residue created in the process of dicing is removed by cleaning the individual semiconductor modules by a chemical solution.

Through these steps, the semiconductor module according to the first embodiment shown in FIG. 1 is produced.

A description will now be given of the advantages provided by the structure of the semiconductor module according to the embodiment.

A thermal simulation for verifying the effect according to the embodiment of reducing the stress applied to the bump revealed that the stress applied to the bump in the direction of peeling (in the direction in which the bump is removed from the semiconductor wafer 30) is about 456 MPa in a related-art case where the rewiring pattern is not depressed, while the stress is about 434 MPa in the embodiment where the rewiring pattern is depressed (i.e., the wiring area of the rewiring pattern is depressed toward the semiconductor wafer in relation to the bump area of the rewiring pattern). Thus, by employing the structure of the embodiment, the stress applied to the bump is reduced by about 5%. This is due the fact that, as the wiring area of the rewiring pattern is thermally expanded, with the bump as an anchor point, due to the heat generated while the semiconductor module is in operation, a moment having a component parallel with the surface of the semiconductor wafer and a downward, vertical component is generated in the wiring area of the rewiring pattern. Since the wiring area of the rewiring pattern, in which such a moment is generated, is connected to the bump via the bump area of the rewiring pattern, a moment commensurate with the moment in the wiring area of the rewiring pattern acts upon the bump. In the thermal simulation, the stress applied to the interface between the bump and the semiconductor substrate is calculated, assuming that the thickness of the insulating layer on the semiconductor wafer is 35 μm, the thickness of the rewiring pattern is 20 μm, the bump provided integrally in the rewiring pattern is of a cylindrical shape having a diameter of 35μ, and the temperature of the semiconductor wafer is between 25° C. and 125° C., which would occur while the circuit is in operation.

According to the semiconductor module and the manufacturing method of the first embodiment, the following advantages are provided.

(1) By forming the rewiring pattern 4 such that the wiring area 5b thereof is depressed toward the semiconductor wafer 30 in relation to the bump area 5a thereof, it is ensured that a moment having a component parallel with the surface of the semiconductor wafer 30 and a downward, vertical component is generated in the wiring area 5b of the rewiring pattern 4, as the wiring area 5b of the rewiring pattern 4 is thermally expanded, with the bump 4a in the bump area 5a as an anchor point, due to the heat generated while the semiconductor module is in operation. Since the wiring area 5b of the rewiring pattern 4, in which such a moment is generated, is connected to the bump 4a via the bump area 5a of the rewiring pattern 4, a moment commensurate with the moment in the wiring area 5b of the rewiring pattern 4 acts upon the bump 4a. Thus, the moment (downward moment) that is generated when a thermal stress is generated in the semiconductor module reduces the stress applied to the bump 4a in the direction of peeling (in the direction in which the bump is removed from the substrate). Therefore, the reliability (thermal reliability) of connection between the electrode 2 and the bump 4a in the semiconductor module is improved.

(2) By forming the insulating layer 7 to have a concave upper surface in an interval between the bumps 4a, the distance (vertical interval) between the rewiring pattern 4 in the interval between the bumps 4a (particularly, the portion of the rewiring pattern 4 in the neighborhood of the bottom of the concave shape of the insulating layer 7) and the semiconductor wafer 30, is smaller than when the upper surface of the insulating layer 7 is not concave (e.g., when the upper surface is parallel with the semiconductor wafer 30) between the bumps 4a. Therefore, heat from the semiconductor wafer 30 is easily transferred to the rewiring pattern 4 so that heat dissipation of the semiconductor module is improved.

(3) By bending the copper plate 4x into a concave shape between the bumps 4a and then patterning the copper plate 4x to form the rewiring pattern 4, it is ensured that a moment having a parallel component parallel with the surface of the semiconductor wafer 30 and a downward, vertical component is generated in the wiring area 5b of the rewiring pattern 4, as the wiring area 5b of the rewiring pattern 4 is thermally expanded, with the bump 4a as an anchor point, due to the heat generated while the semiconductor module is in operation. Since the wiring area 5b of the rewiring pattern 4, in which such a moment is generated, is connected to the bump 4a via the bump area 5a of the rewiring pattern 4, a moment commensurate with the moment in the wiring area 5b of the rewiring pattern 4 acts upon the bump 4a. Thus, it is possible to manufacture a semiconductor module in which the stress applied to the bump 4a in the direction of peeling (in the direction in which the bump is removed from the semiconductor wafer 30) in the presence of thermal stress in the semiconductor module is reduced, and in which the reliability (thermal reliability) of connection between the electrode 2 and the bump 4a is improved.

(4) In pressure-bonding the copper plate 4x and the semiconductor wafer 30 via the insulating layer 7, the copper plate 4x can be bent into a concave shape without requiring any additional apparatuses. Therefore, the rewiring pattern 4 (particularly, the wiring area 5b of the rewiring pattern 4), which is formed by etching the copper plate 4x, is easily formed into a concave shape, and a semiconductor module in which the stress, applied in the direction of peeling to the bump 4a connected to the rewiring pattern 4, is reduced can be manufactured at a low cost.

(5) Since the rewiring patterns 4 having the bumps 4a are formed collectively while the semiconductor wafer 30 is not diced into individual semiconductor modules, the cost of manufacturing the semiconductor module is reduced as compared with a case where the rewiring pattern 4 is formed in the semiconductor modules on an individual basis.

(6) By forming the bump 4a and the rewiring pattern 4 integral with each other, disconnection or the like is relatively less likely to occur even when thermal stress is applied to the interface between the bump 4a and the rewiring pattern 4 due to variation in temperature occurring when the circuit is in operation. This is because no parts (interfaces) connect different materials on a path between the electrode 2 of the semiconductor substrate 1 and the electrode 9. Thus, connection reliability due to thermal stress in the semiconductor module is prevented from being lowered.

Second Embodiment

Figure 7:
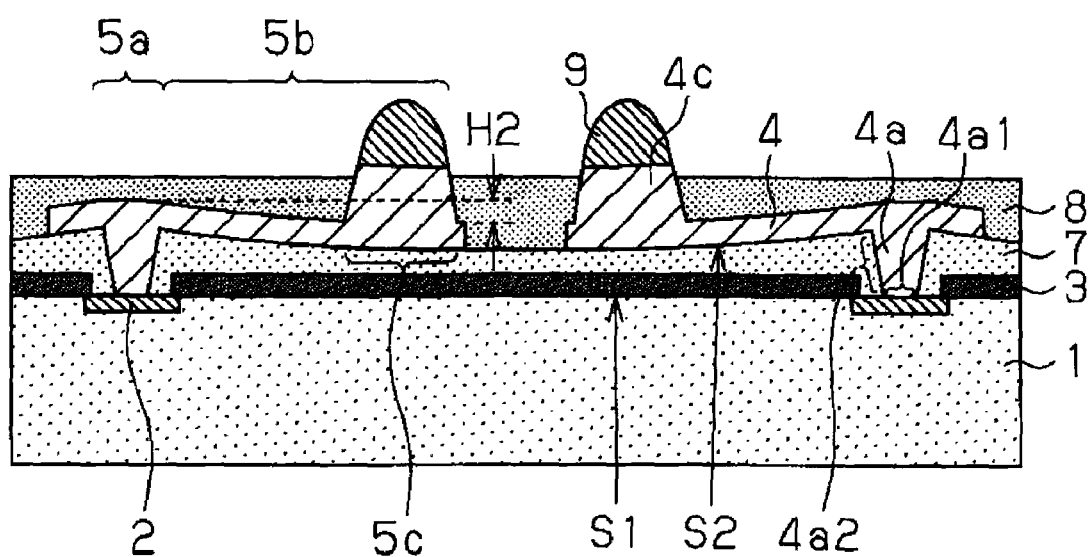
FIG. 7 is a sectional view showing a semiconductor module according to a second embodiment.

FIG. 7 is a sectional view showing a semiconductor module according to a second embodiment. The difference from the first embodiment is that a convex post 4c provided with the rewiring pattern 4 as one body is provided on the surface opposite to the surface S2 in the pad electrode area 5c of the rewiring pattern 4. The upper surface of the post 4c is exposed through the solder resist layer 8, and the electrodes 9 are formed on the exposed surface. The other aspects of the second embodiment are the same as the corresponding aspects of the first embodiment.

(Manufacturing Method)

FIGS. 8A through 9C are sectional views showing the process of manufacturing the semiconductor module according to the second embodiment.

Figure 8A:
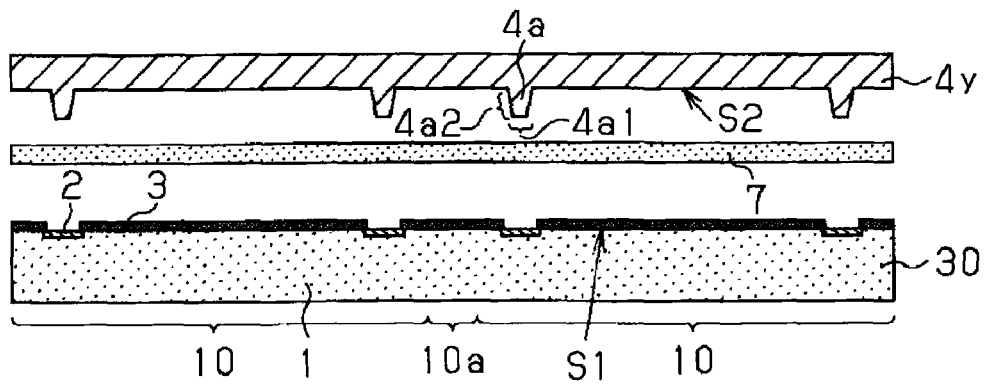
FIGS. 8A-8D are sectional views showing the process of manufacturing the semiconductor module according to the second embodiment.

First, the copper plate 4y having the bumps 4a and manufactured through the steps shown in FIGS. 3A through 4D is prepared. Unlike the copper plate 4x of the first embodiment, the thickness of the copper plate 4y is not reduced. As shown in FIG. 8A, the semiconductor wafer 30 and the copper plate 4y having the bumps 4a are placed so as to sandwich the insulating layer 7 on the surface (upper surface) S1 of the semiconductor wafer 30.

Figure 8B:
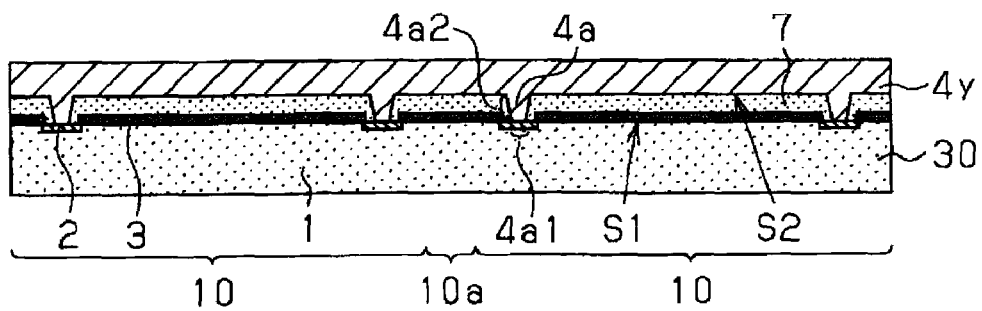

As shown in FIG. 8B, the semiconductor wafer 30, the insulating layer 7, and the copper plate 4y are integrated by pressure-molding the sandwiched assembly as described above by a press machine. The conditions for press work are the same as described in the first embodiment.

Figure 8C:
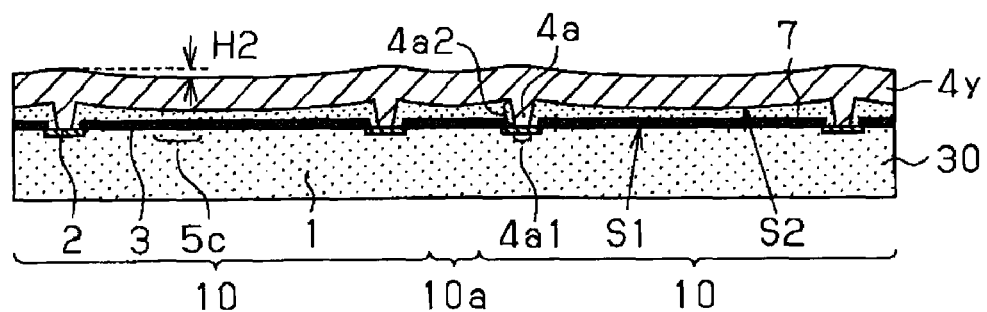

As shown in FIG. 8C, by cooling the press-bonded assembly comprising the copper plate 4y and the insulating layer 7 for film shrinkage, the copper 4y is bent into a concave shape, anchored by the bumps 4a, with the result that the insulating layer 7 in an interval between the bumps 4a has a concave upper surface which is progressively thinner toward the center thereof away from the bumps 4a. Thus, the upper surface of the copper plate 4y is bent into a concave shape, fitting the surface of the insulating layer 7, and is finished such that the upper surface of the copper plate 4y corresponding to the wiring area 5b is depressed in relation to the upper surface of the copper plate 4y corresponding to the bump area 5a. The amount of depression H2 of the copper plate 4y in an interval between the bumps 4a (part corresponding to the pad electrode area 5c) is about 25 μm.

Figure 8D:
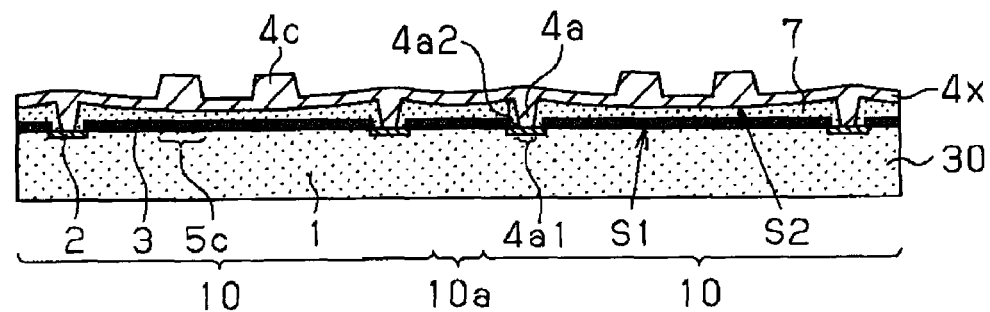

As shown in FIG. 8D, lithography and etching are used to work the copper plate 4y so as to form an isolation trench on the surface of the copper plate 4y opposite to the surface S2. In this way, the copper plate 4y is worked into the copper plate 4x having a predetermined, reduced thickness (the thickness of the rewiring pattern 4). The posts 4c having a predetermined truncated cone pattern are formed in the pad electrode area 5c on the surface opposite to the surface S2 so as to be integral with the copper plate 4x.

Figure 9A:
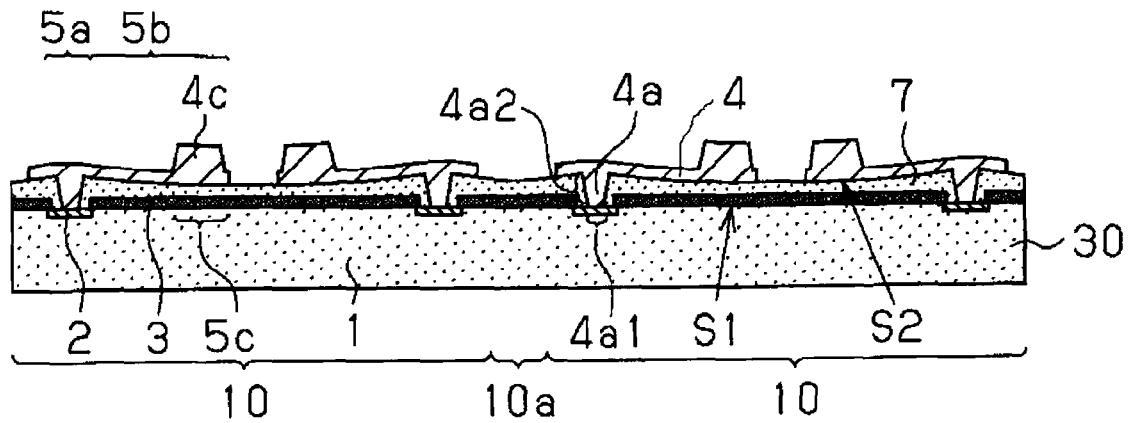
FIGS. 9A-9C are sectional views showing the process of manufacturing the semiconductor module according to the second embodiment.

Subsequently, as shown in FIG. 9A, lithography and etching are performed so as to work the copper plate x into the rewiring pattern 4. As in the first embodiment, the rewiring pattern 4 comprises the bump area 5a in which the bump 4a is provided and the wiring area 5b extending contiguously with the area 5a. The wiring area 5b of the rewiring pattern 4 is depressed toward the semiconductor wafer 30 in relation to the bump area 5a of the rewiring pattern 4, reflecting the concave upper shape of the copper plate 4x. The convex post 4c is formed integrally with the pad electrode area 5c of the rewiring pattern 4.

Figure 9B:
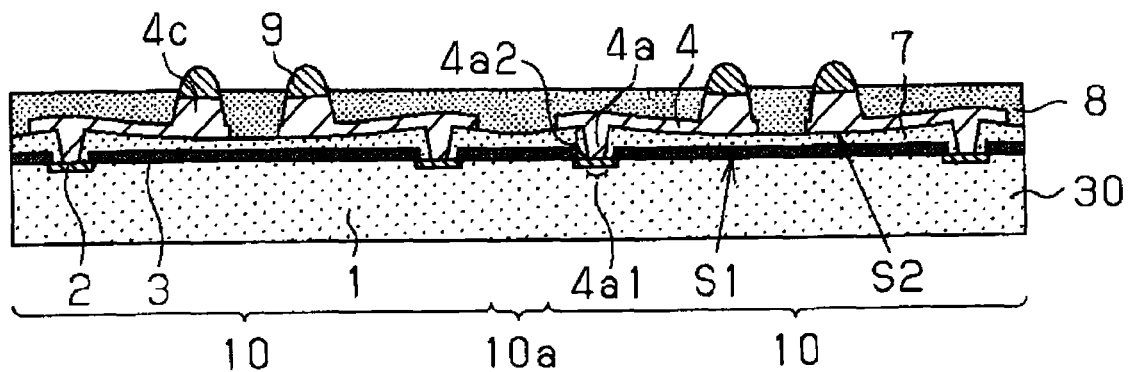

As shown in FIG. 9B, the solder resist layer 8 is laminated so as to expose the post 4c of the rewiring pattern 4 on the surface through lithographic steps and to cover the insulating layer 7 and the rewiring pattern 4 on the semiconductor wafer 30. Solder printing is used to form the electrode 9 on the exposed surface of the post 4c of the rewiring pattern 4.

Figure 9C:
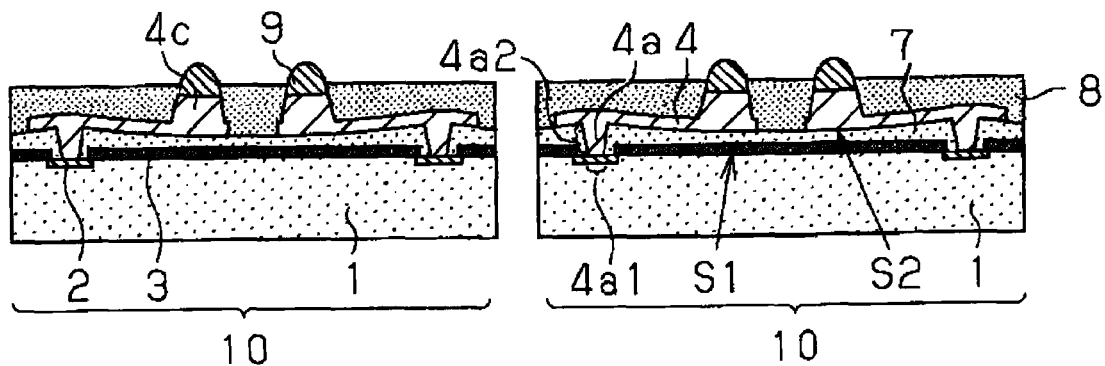

As shown in FIG. 9C, individual semiconductor modules having the same outer dimension as the semiconductor substrate 1 are produced by dicing the semiconductor wafer 30 from beneath (underside) the wafer 30 along the scribe lines 10a which define the plurality of semiconductor module areas 10. Residue created in the process of dicing is removed by cleaning the individual semiconductor modules by a chemical solution.

Through these steps, the semiconductor module according to the second embodiment shown in FIG. 7 is produced.

According to the semiconductor module and the manufacturing method according to the second embodiment, the following advantages are provided in addition to the advantages (1)-(6) discussed above.

(7) By providing the convex post 4c in the rewiring pattern 4, thermal stress applied to the electrode 9 provided contiguous with the post 4c can be reduced because the post 4c is deformed according to the horizontal stress. Therefore, the connection reliability of the electrode 9 is improved.

(8) By forming the bump 4a and the post 4c integrally with the rewiring pattern 4, disconnection is relatively less likely to occur even when heat stress is applied to the interface between the bump 4a and the rewiring pattern 4 or the interface between the rewiring pattern 4 and the post 4c due to variation in temperature occurring when the circuit is in operation. This is because no parts (interfaces) connect different materials on a path between the electrode 2 of the semiconductor substrate 1 and the electrode 9. Thus, connection reliability due to thermal stress in the semiconductor module is prevented from being lowered.

(9) Since the path from the electrode 2 of the semiconductor substrate 1 to the electrode 9 can be formed by etching a single copper plate 4y, the steps of manufacturing the circuit device using the CSP technology are simplified. Further, the cost of manufacturing the circuit device is reduced.

Third Embodiment

FIGS. 10A-10D are sectional views showing the method of forming a metal plate having bumps according to a third embodiment. FIGS. 11A-11C are sectional views showing the process of manufacturing a semiconductor module according to the third embodiment. The structure of the semiconductor module according to the third embodiment is the same as that of the second embodiment. The difference from the second embodiment resides in the manufacturing method. More specifically, the semiconductor module according to the third embodiment is manufactured by forming the convex posts 4c integral with the copper plate 4x on the surface opposite to the surface S2 before bonding, and then by pressure-bonding the copper plate 4x to the semiconductor wafer 30 via the insulating layer 7. The post 4c is an example of the "post" according to the invention.

Figure 10A:
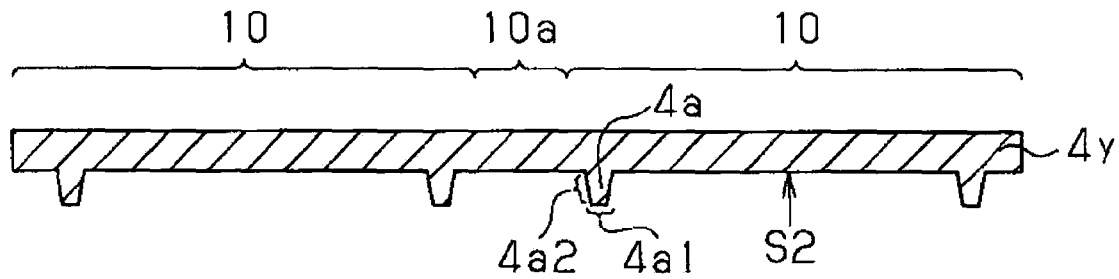
FIGS. 10A-10D are sectional views showing the method of forming a metal plate having bumps according to a third embodiment.
Figure 11A:
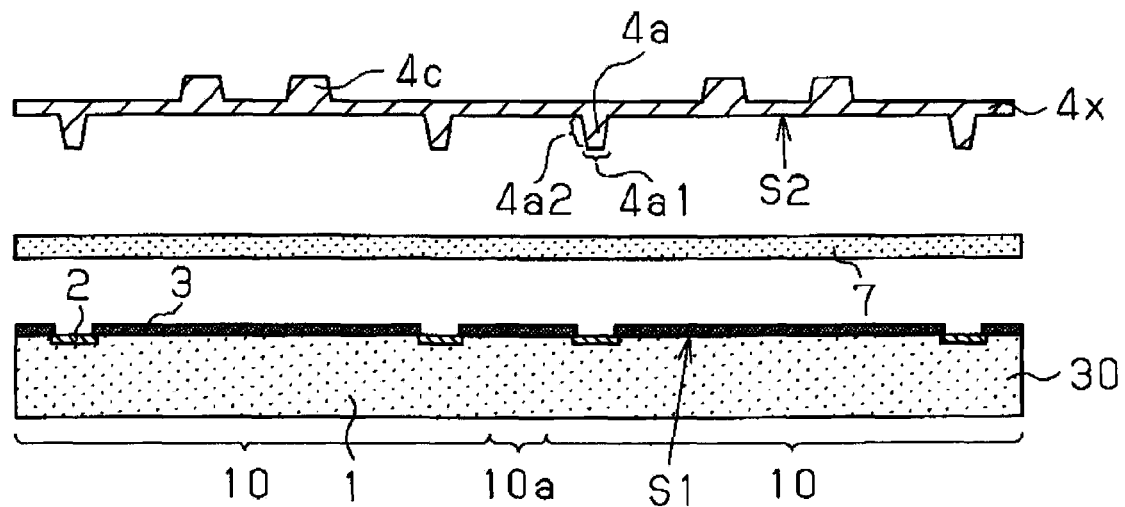
FIGS. 11A-11C are sectional views showing the process of manufacturing a semiconductor module according to the third embodiment.
Figure 11B:
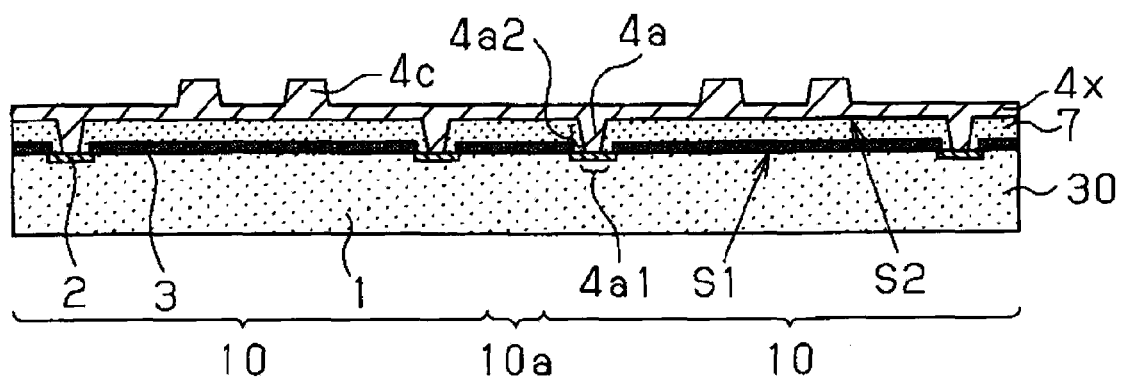
Figure 11C:
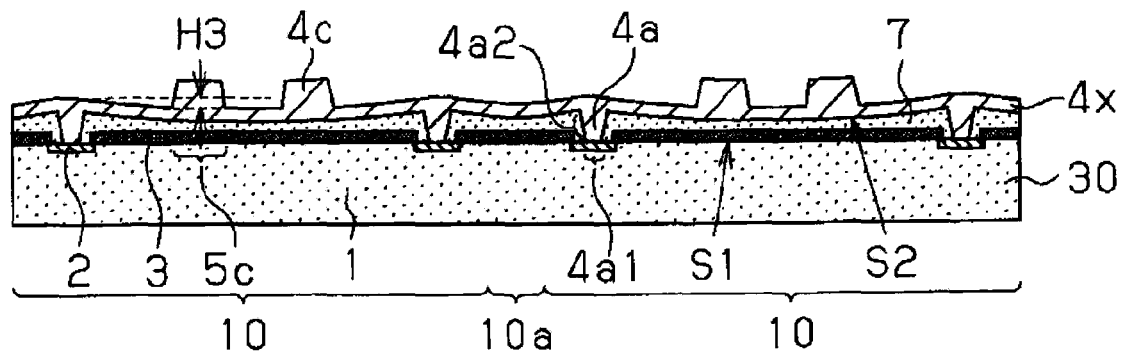

First, as shown in FIG. 10A, the copper plate 4y having the bumps 4a and manufactured through the steps shown in FIGS. 3A through 4D is prepared. The copper plate 4y is the same as the copper plate employed in the second embodiment.

Figure 10B:
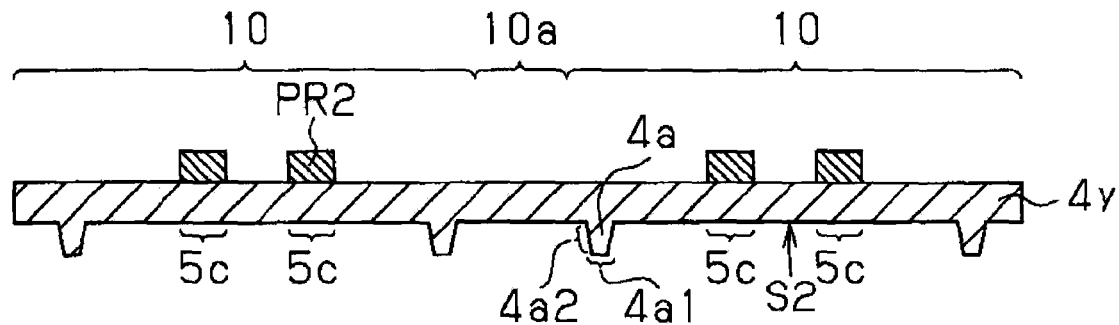

As shown in FIG. 10B, lithographic steps are used to form resist masks PR2 in areas within each of the semiconductor module areas 10 corresponding to the pad electrode areas 5c. A resist protective film (not shown) is formed on the surface (surface S2) opposite to the surface on which the resist masks PR2 are provided, so as to protect the copper plate 4y.

Figure 10C:
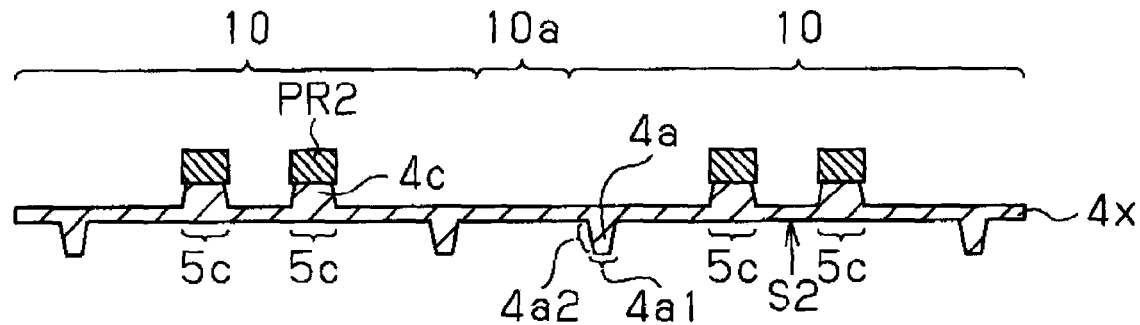

As shown in FIG. 10C, wet etching using a chemical solution such as a ferric chloride solution is performed by using the resist masks PR2 as a mask, and isolation trenches are formed on the surface of the copper plate 4y opposite to the surface S2. In this way, the copper plate 4y is worked into the copper plate 4x having a predetermined, reduced thickness (the thickness of the rewiring pattern 4). The posts 4c having a predetermined truncated cone pattern are formed in the pad electrode area 5c on the surface opposite to the surface S2 so as to be integral with the copper plate 4x.

Figure 10D:
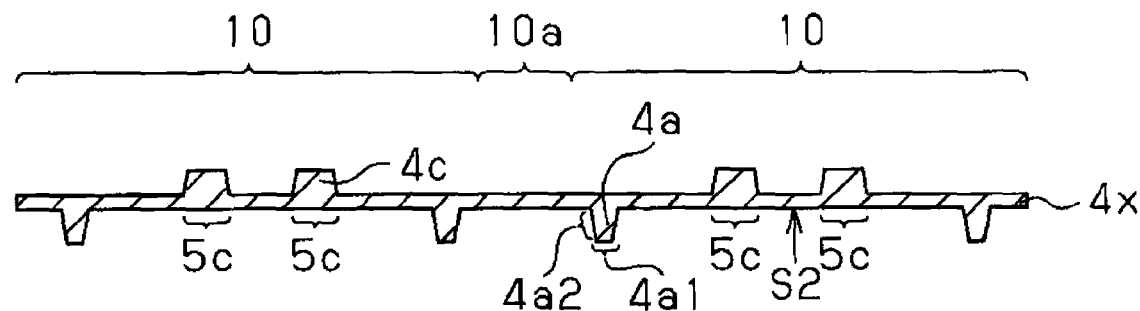

As shown in FIG. 10D, the resist masks PR2 and the resist protective film are removed. In this way, the copper plate 4x, worked to a desired thickness, having the bumps 4a integrally formed on the surface S2, and having the posts 4c integrally formed in the pad electrode areas 5c on the surface opposite to the surface S2, is formed.

The copper plate 4x, thus manufactured to have the bumps 4a and the posts 4c, is used in the process described below of manufacturing the semiconductor module according to the third embodiment.

As shown in FIG. 11A, the semiconductor wafer 30 and the copper plate 4x having the bumps 4a and the posts 4c are placed so as to sandwich the insulating layer 7 on the surface S1 (upper surface) of the semiconductor wafer 30.

As shown in FIG. 11B, the semiconductor wafer 30, the insulating layer 7, and the copper plate 4x are integrated, superimposed one on another, by pressure-molding the sandwiched assembly as described above by a press machine. The conditions for press work are the same as described in the first embodiment. In this process, the pressure applied to the convex post 4c depresses the associated part of the copper plate 4x between the bumps 4a. Further, by cooling the insulating layer 7 for film shrinkage, the copper plate 4x is further bent into a concave shape, anchored by the bumps 4a, with the result that, as shown in FIG. 11C, the insulating layer 7 in an interval between the bumps 4a has a concave upper surface which is progressively thinner toward the center thereof away from the bumps 4a. Thus, the upper surface of the copper plate 4x is bent into a concave shape, fitting the surface of the insulating layer 7, and is finished such that the copper plate 4x corresponding to the wiring area 5b is depressed toward the semiconductor wafer 30 in relation to the copper plate 4x corresponding to the bump area 5a. The amount of depression H3 of the copper plate 4x in an interval between the bumps 4a (part corresponding to the pad electrode area 5c) is about 30 µm.

The semiconductor module according to the third embodiment is manufactured through the steps shown in FIGS. 9A-9C.

According to the semiconductor module and the manufacturing method according to the third embodiment, the following advantages are provided in addition to the advantages (1)-(9).

(10) By forming the convex post 4c integral with the copper plate 4x on the surface opposite to the surface S2 on which the bumps 4a are formed, and at a location not overlapping the bump 4a, the pressure applied to the convex post 4c, in addition to the deformation of the insulating layer 7 caused by the shrinkage thereof, helps bend the copper plate 4x into a concave shape in an interval between the bumps 4a in the process of pressure-bonding the copper plate 4x and the semiconductor wafer 30 via the insulating layer 7. Thus, the semiconductor module with improved connection reliability can be manufactured more reliably and more precisely.

Fourth Embodiment

Figure 12:
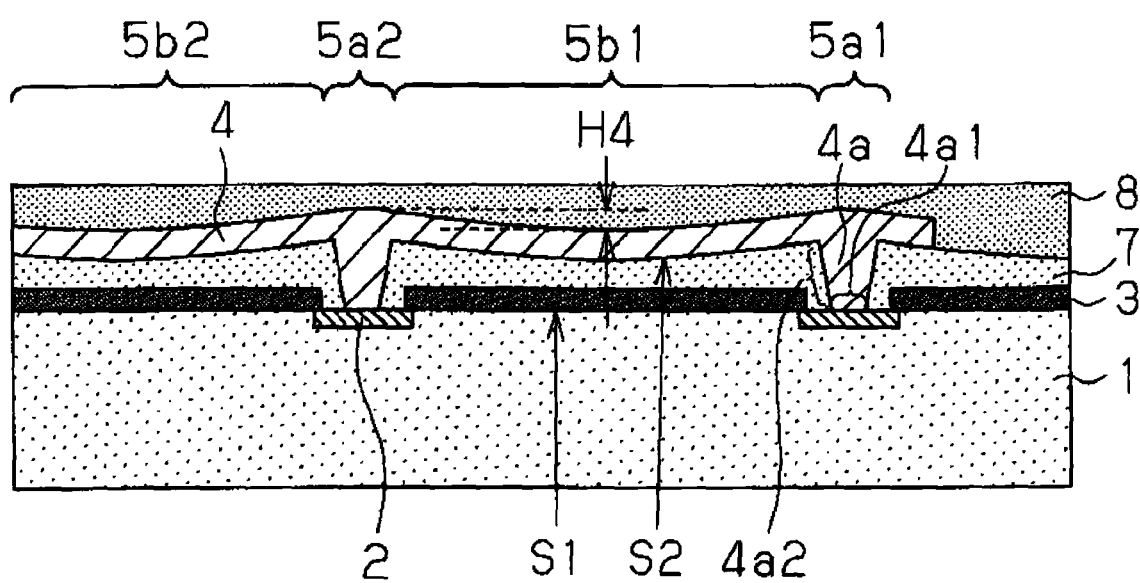
FIG. 12 is a sectional view showing a semiconductor module according to a fourth embodiment.

FIG. 12 is a sectional view showing a semiconductor module according to a fourth embodiment.

A semiconductor substrate 1 in the semiconductor module according to the fourth embodiment is such that a semiconductor device (not shown) such as an integrated circuit is formed on the surface S1 thereof (upper surface) by using a well-known technology. An electrode 2 for the semiconductor device is formed on the surface S1 (mounting surface). A protective film 3 is formed on at least a part of the surface of the semiconductor substrate 1 so as to expose a certain area (center) of the electrode 2. An insulating layer 7 covering the electrode 2 and the protective film 3 is formed on the semiconductor substrate 1. There are also provided a plurality of bumps 4a penetrating the insulating layer 7 and connected to the exposed surface of the electrode 2, and a rewiring pattern 4 with the bumps formed on its surface S2 (lower surface). The rewiring pattern 4 comprises a bump area 5a1 (5a2) in which the bump 4a is provided and a wiring area 5b1 (5b2) extending contiguously with the region 5a1. The insulating layer 7 is formed to have a concave upper surface in an interval between the bumps 4a. For example, the wiring area 5b1 of the rewiring pattern 4 is formed to fit the upper surface. For this reason, the wiring area 5b1 of the rewiring pattern 4 is depressed toward the semiconductor substrate 1 in relation to the bump area 5a1 (5a2) of the rewiring pattern 4. The amount of depression H4 is about 20 µm. In a certain area of the rewiring pattern 4 opposite (upper surface) to the surface S2 is provided an electrode (not shown) for external connection. The other areas are covered by a solder resist layer 8. The semiconductor module as described can be easily manufactured by the method of the first embodiment.

According to the semiconductor module and the manufacturing method of the fourth embodiment, at least the advantages of the first embodiment are enjoyed.

Fifth Embodiment

FIGS. 13A-13D are sectional views showing the method of forming a metal plate having bumps according to a fifth embodiment. FIGS. 14A-14C are sectional views showing the process of manufacturing a semiconductor module according to the fifth embodiment. The structure of the semiconductor module according to the fifth embodiment is the same as that of the first embodiment. The difference from the first embodiment resides in the manufacturing method.

A description will be given of a method of forming a metal plate having bumps (a copper plate 4*x* integrally formed with the bumps 4*a*).

Figure 13A:
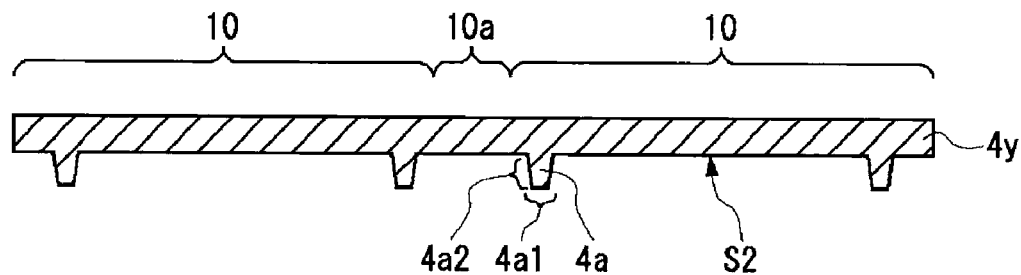
FIGS. 13A-13D are sectional views showing the method of forming a metal plate having bumps according to a fifth embodiment.
Figure 14A:
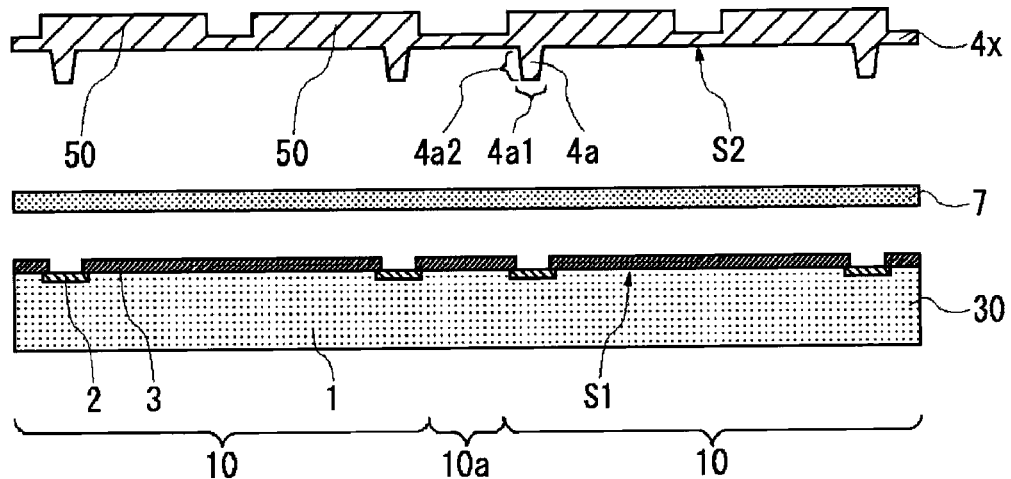
FIGS. 14A-14C are sectional views showing the process of manufacturing a semiconductor module according to the fifth embodiment.
Figure 14B:
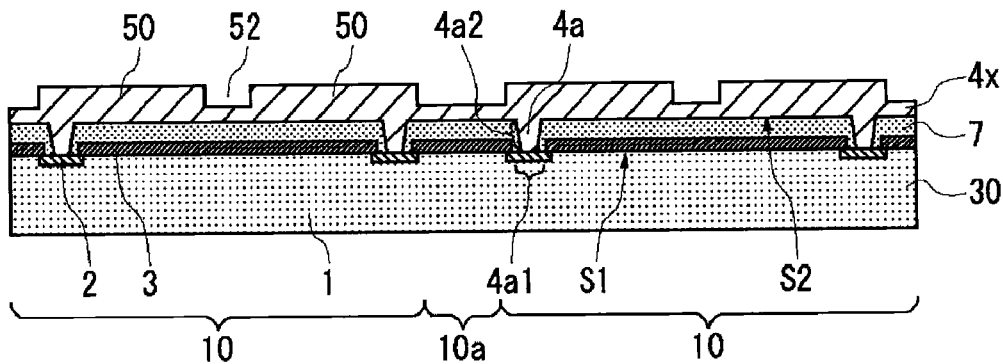
Figure 14C:
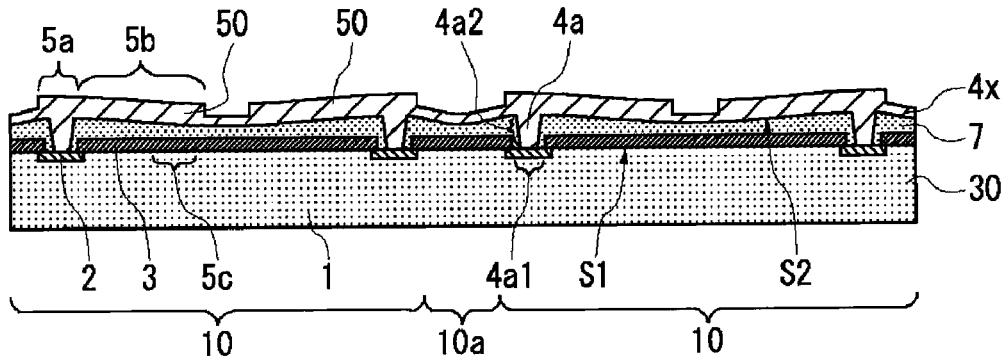

First, as shown in FIG. 13A, the copper plate 4*y* having bumps 4*a* and manufactured through the steps shown in FIGS. 3A through 4D is prepared. The copper plate 4*y* is the same as the copper plate employed in the first embodiment.

Figure 13B:
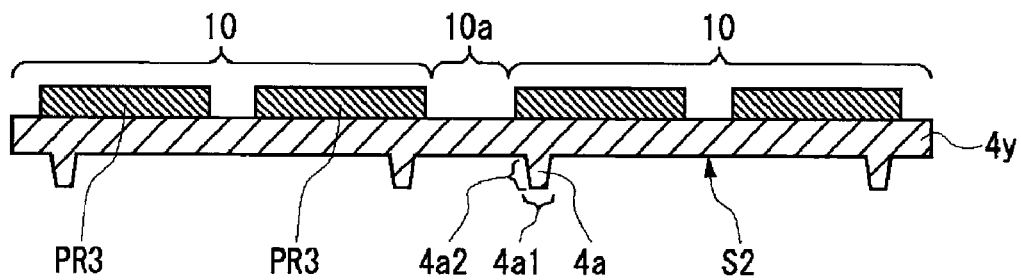

As shown in FIG. 13B, lithographic steps are used to form resist masks PR3 in areas for rewiring patterns, including the bumps 4*a*, within each of the semiconductor module areas 10. A resist protective film (not shown) is formed on the surface (surface S2) opposite to the surface on which the resist masks PR3 are provided, so as to protect the copper plate 4*y*.

Figure 13C:
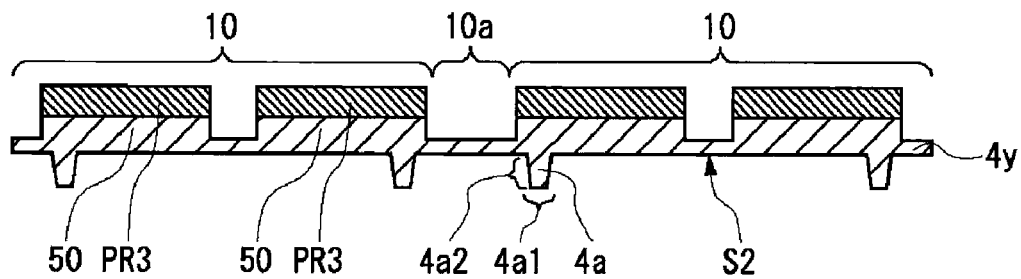

Then, as shown in FIG. 13C, wet etching using a chemical solution such as a ferric chloride solution is performed by using the resist masks PR3 as a mask so as to half-etch the surface opposite to the surface S2 of the copper plate 4*y* outside the rewiring pattern areas. This results in the surface opposite to the surface S2 of the copper plate 4*y* being a stepped surface, where the rewiring pattern areas represent convex parts 50. Preferably, the step difference between the depression and the convex part is substantially equal to the thickness of the rewiring pattern 4 described later.

Figure 13D:
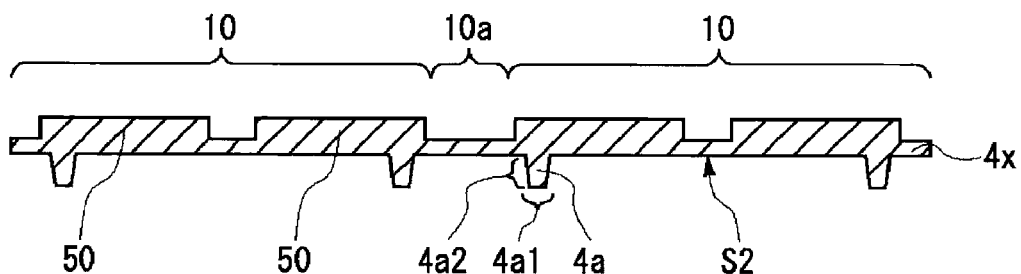

As shown in FIG. 13D, the resist masks PR3 and the resist protective film are removed. In this way, a copper plate 4*x*, worked to a desired thickness, having the bumps 4*a* integrally formed on the surface S2, and having a stepped surface opposite to the surface S2 where the rewiring pattern areas represent the convex parts 50, is formed.

The copper plate 4*x*, thus manufactured to have the bumps 4*a* and the convex parts 50, is used in the process described below of manufacturing the semiconductor module according to the fifth embodiment.

As shown in FIG. 14A, the semiconductor wafer 30 and the copper plate 4*y* having the bumps 4*a* and the convex parts 50 are placed so as to sandwich the insulating layer 7 on the surface S1 (upper surface) of the semiconductor wafer 30.

As shown in FIG. 14B, the semiconductor wafer 30, the insulating layer 7, and the copper plate 4*x* are integrated, superimposed one on another, by pressure-molding the sandwiched assembly as described above by a press machine. The conditions for press work are the same as described in the first embodiment. In this process, the pressure applied to the convex parts 50 depresses the associated part of the copper plate 4*x* between the bumps 4*a*. In this embodiment, the thickness of a depression 52 is reduced in the press work so that the depression 52 is easily thrust into the insulating layer 7. Therefore, the copper plate 4*x* is more easily bent, anchored by the bumps 4*a*. Further, by cooling the insulating layer 7 for film shrinkage, the copper plate 4*x* is further bent into a concave shape, anchored by the bumps 4*a*, with the result that, as shown in FIG. 14C, the insulating layer 7 in an interval between the bumps 4*a* has a concave upper surface which is progressively thinner toward the center thereof away from the bumps 4*a*. Thus, the upper surface of the copper plate 4*x* is bent into a concave shape, fitting the surface of the insulating layer 7, and is finished such that the copper plate 4*x* corresponding to the wiring area 5*b* is depressed toward the semiconductor wafer 30 in relation to the copper plate 4*x* corresponding to the bump area 5*a*.

Figure 15:
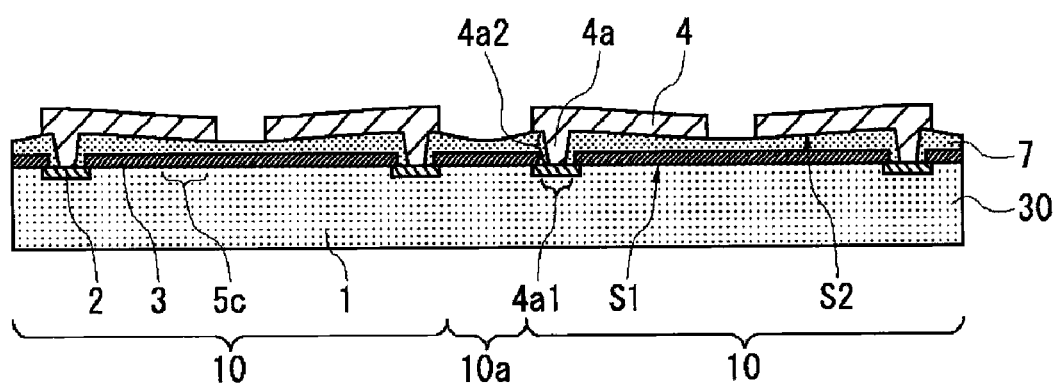
FIG. 15 is a sectional view showing the process of manufacturing a semiconductor module according to the fifth embodiment.

Subsequently, as shown in FIG. 15, the rewiring pattern 4 is formed by etching back the surface opposite to the surface S2 of the copper plate 4*x*.

The semiconductor module according to the fifth embodiment is manufactured through the steps shown in FIGS. 6B-6C.

According to the semiconductor module and the manufacturing method of the fifth embodiment, the following advantages are provided.

(11) The thickness of a depression 52 is reduced in the press work for integrating the semiconductor wafer 30, the insulating layer 7, and the copper plate 4*x* so that the depression 52 is easily thrust into the insulating layer 7. Therefore, the copper plate 4*x* is more easily bent, anchored by the bumps 4*a*.

Sixth Embodiment

Figure 16:
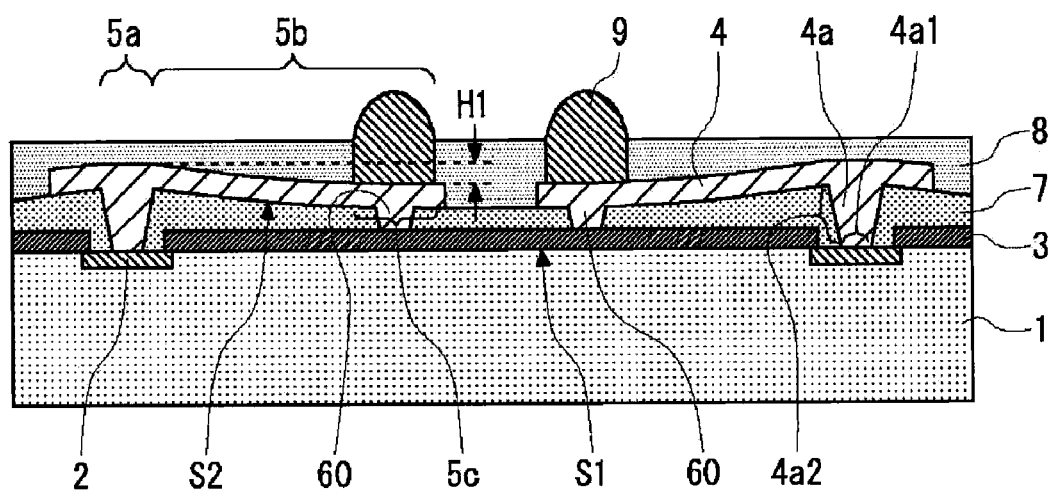
FIG. 16 is a sectional view showing a semiconductor module according to a sixth embodiment.

FIG. 16 is a sectional view showing a semiconductor module according to a sixth embodiment. The basic structure of the semiconductor module according to the six embodiment is the same as that of the first embodiment. The difference is that a dummy bump 60 is provided on the surface opposite to the surface S2 of the rewiring pattern 40, so as to correspond to the position of the electrode 9 for external connection. The top of the dummy bump 60 is not connected to the electrode 2 provided on the semiconductor substrate 1 but is in contact with the protective film 3. In other words, the dummy bump 60 is a bump supported by the semiconductor substrate 1 but is not electrically connected to the semiconductor substrate 1.

A description will be given of a method of forming a metal plate having bumps and dummy bumps (a copper plate 4*x* integrally formed with the bumps 4*a* and the dummy bumps 60). FIGS. 17A through 17E are sectional views showing the method of forming a metal plate having bumps and dummy bumps.

Figure 17A:
FIGS. 17A-17E are sectional views showing the method of forming a metal plate having bumps and dummy bumps according to the sixth embodiment.

As shown in FIG. 17A, a copper plate 4*z* thicker than the sum of the height of the bump 4*a* and the thickness of the rewiring pattern 4 is prepared. It will be assumed here that the thickness of the copper plate 4*z* is about 100 μm. A rolled metal comprising rolled copper is used to form the copper plate 4*z*.

Figure 17B:
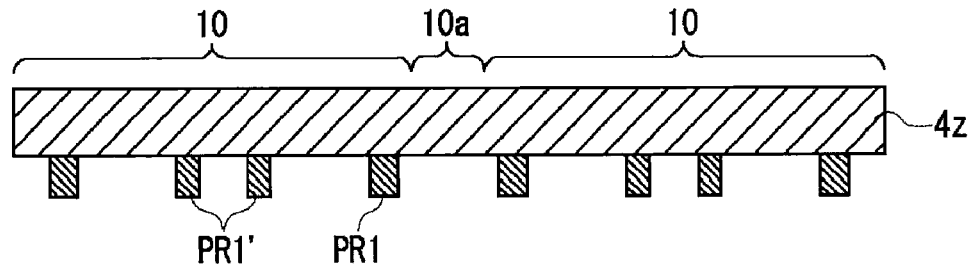

As shown in FIG. 17B, lithographic steps are used to form resist masks PR1 and resist masks PR1' in areas for bumps and areas for dummy bumps within each of the semiconductor module areas 10. The areas for bumps are arranged to correspond to the positions of the electrodes 2 of the semiconductor substrate 1 in the semiconductor wafer 30, which is partitioned by the plurality of scribe lines 10*a* into the plurality of semiconductor module areas 10. The resist masks PR1' in this embodiment are arranged to correspond to the positions of the electrodes 9. The diameter of the resist mask PR1' is smaller than the diameter of the resist mask PR1. For example, the diameter of the resist mask PR1 may be 100 μmφ, and the diameter of the resist mask PR1' may be 50 μmφ. A resist protective film (not shown) is formed on the entirety of the surface (upper surface) opposite to the surface in which the resist masks PR1 are provided, so as to protect the copper plate 4*z*.

Figure 17C:
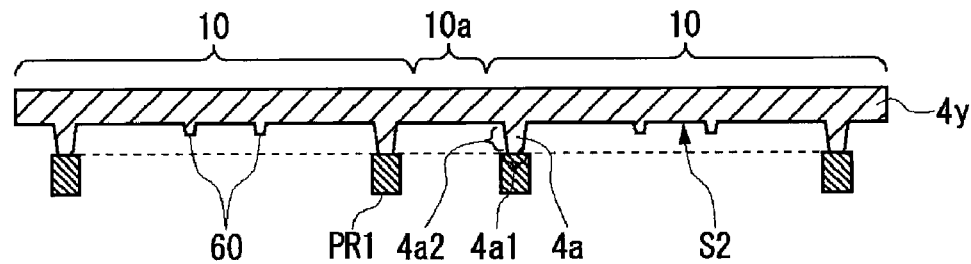

Then, as shown in FIG. 17C, wet etching using a chemical solution such as a ferric chloride solution is performed by using the resist masks PR1 and the resist masks PR1' as a mask, so as to form the bumps 4a and the dummy bumps 60 projecting from the surface S2 of the copper plate 4y and having a predetermined truncated cone pattern. The dummy bump 60 is lower than the bump 4a. The dummy bump 60 is formed by etching the surface of the copper plate 4y using the resist mask PR1 and the resist mask PR1' as a mask, and then performing overetching.

Figure 17D:
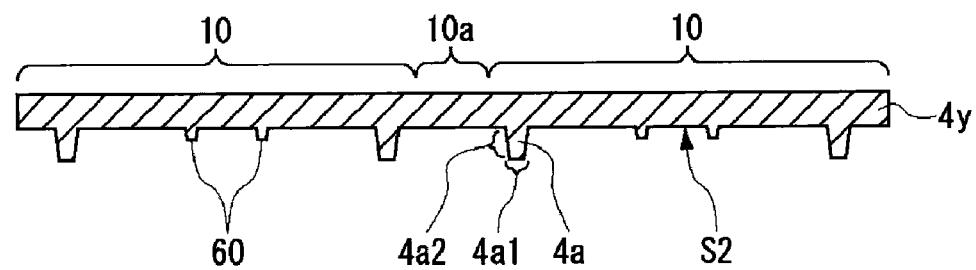

As shown in FIG. 17D, the resist mask PR1 and the resist protective film are removed. With this, the bumps 4a and the dummy bumps 60 are integrally formed on the surface S2 of a copper plate 4y. A metal mask such as a silver (Ag) mask may be used in place of the resist mask PR1 or the resist mask PR1'. With this, satisfactory etching selectivity ratio between the mask and the copper plate 4z is ensured so that the bumps 4a and the dummy bumps 60 can be even finely patterned.

Figure 17E:
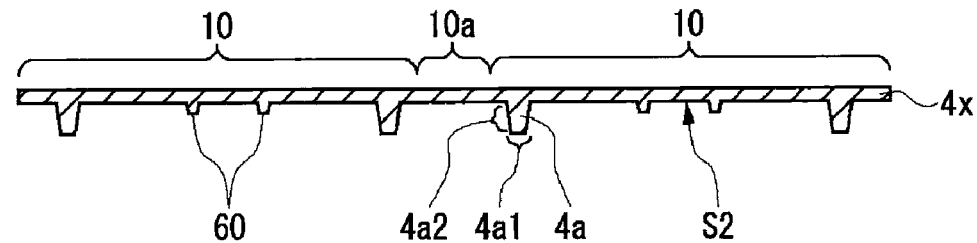

As shown in FIG. 17E, the thickness of the copper plate 4y is reduced by, for example, wet etching the entirety of the copper plate 4y from the side opposite to the surface S2, using a chemical solution such as a ferric chloride solution. In this process, the resist protective film (not shown) is formed on the surface S2 so as to protect the bumps 4a, the dummy bumps 60, and the copper plate 4y. The resist protective film is removed after the etching process. In this way, a copper plate 4x, worked to a desired thickness (the thickness of the rewiring pattern 4) and having the bumps 4a and the dummy bumps 60 integrally formed thereon (S2), is formed. The copper plate 4x is an example of the "metal plate" according to the invention.

The copper plate 4x, thus manufactured to have the bumps 4a and the dummy bumps 60, is used in the process described below of manufacturing the semiconductor module according to the sixth embodiment. FIGS. 18A through 19C are sectional views showing the process of manufacturing the semiconductor module according to the sixth embodiment.

Figure 18A:
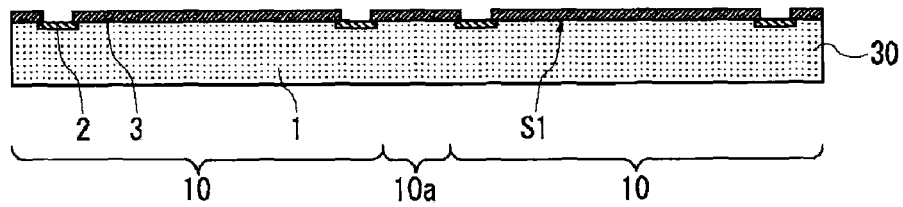
FIGS. 18A-18D are sectional views showing the process of manufacturing the semiconductor module according to the sixth embodiment.

As shown in FIG. 18A, the semiconductor wafer 30 is prepared on the surface (upper surface) S1 of which is provided the semiconductor module areas 10 having the electrode 2 and the protective film 3. The semiconductor wafer 30 is as shown in FIG. 5A of the first embodiment.

Figure 18B:
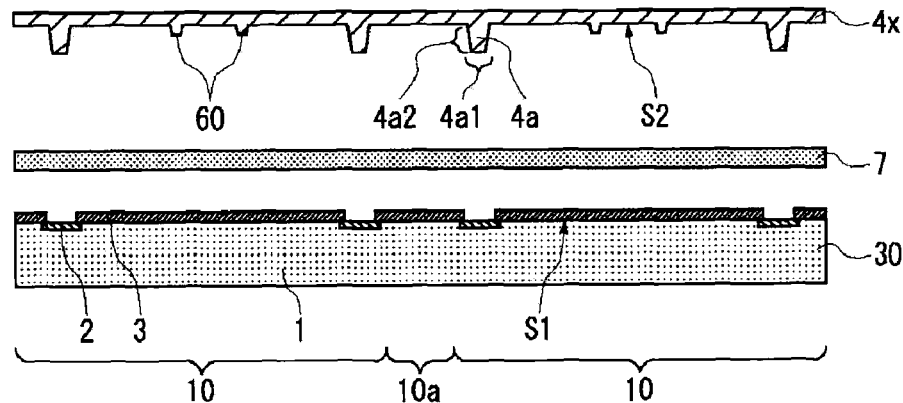

As shown in FIG. 18B, the semiconductor wafer 30 and the copper plate 4x integrally formed with the bumps 4a and the dummy bumps 60 are placed so as to sandwich the insulating layer 7 on the surface S1 of the semiconductor wafer 30. The thickness of the insulating layer 7 is about 35 μm, which is substantially equal to the height of the bump 4a. The copper plate 4x having the bumps 4a is formed as described above.

Figure 18C:
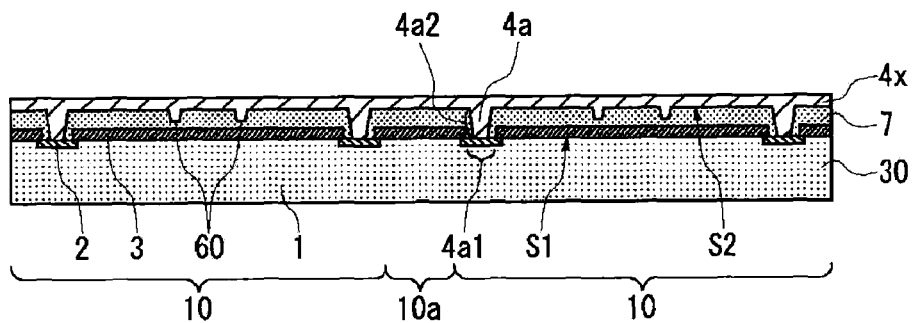

As shown in FIG. 18C, the semiconductor wafer 30, the insulating layer 7, and the copper plate 4x are integrated by pressure molding the assembly as described above by a press machine. The pressure and the temperature of the press work are about 5 MPa and 200° C., respectively. The press work lowers the viscosity of the insulating layer 7 so that the insulating layer 7 undergoes plastic flow. This allows the bump 4a to penetrate the insulating layer 7 so that the bump 4a and the electrode 2 are electrically connected. Since the bump 4a has the side part 4a2 formed to be progressively smaller in diameter toward the end part 4a1, the bump 4a penetrates the insulating layer 7 smoothly. As a result, the insulating layer 7 is effectively drained out from the interface between the bump 4a and the electrode 2, preventing a portion of the insulating layer 7 from remaining as the residue. Meanwhile, the dummy bump 60 is lower than the bump 4a and so is embedded in the insulating layer 7 with the result that the insulating layer 7 is disposed between the top of the dummy bump 60 and the protective film 3.

Figure 18D:
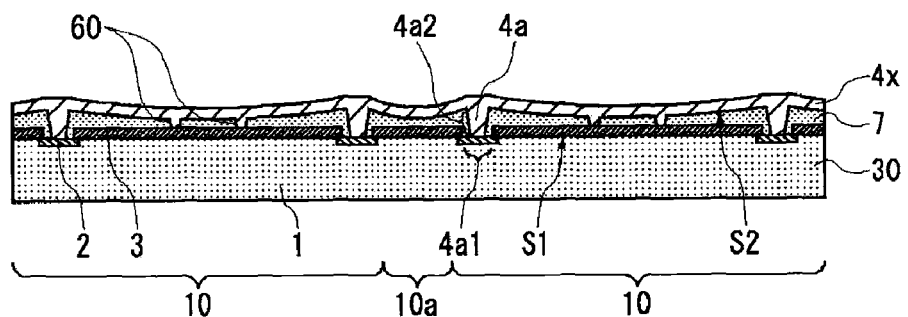

As shown in FIG. 18D, by cooling the press-bonded assembly comprising the copper plate 4x and the insulating layer 7 for film shrinkage, the copper 4x is bent into a concave shape, anchored by the bumps 4a, with the result that the insulating layer 7 in an interval between the bumps 4a has a concave upper surface which is progressively thinner toward the center thereof away from the bumps 4a. Thus, the copper plate 4x is bent into a concave shape depressed toward the semiconductor wafer 30, fitting the surface of the insulating layer 7, and is finished such that the upper surface of the copper plate 4x in the wiring area 5b is depressed in relation to the upper surface of the copper plate 4x in the bump region 5a. As a result of the copper plate 4x being bent into a concave shape depressed toward the semiconductor wafer 30, fitting the surface of the insulating layer 7, the end of the dummy bump 60 comes into contact with the protective film 3. As a result, the copper plate 4x bent into a concave shape is supported by the dummy bump 60. Thus, since the height of the dummy bump 60 defines a distance between the copper plate 4x and the protective film 3, the concave shape or the degree of bending of the copper plate 4x can be adjusted by the dummy bump 60. Before cooling the layer 7, resin is completely hardened to ensure that the bump providing the support does not move. This can be achieved by, for example, heating and pressure-bonding the assembly comprising the layer 7 and the plate 4x at 240° C. and for two hours, and by keeping applying pressure to the assembly while the assembly is being cooled to room temperature.

Figure 19A:
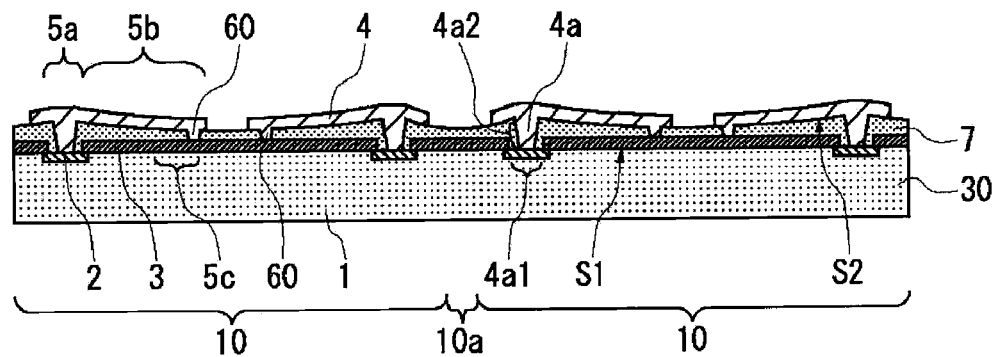
FIGS. 19A-19C are sectional views showing the process of manufacturing the semiconductor module according to the sixth embodiment.

Subsequently, as shown in FIG. 19A, lithography and etching are used to work the copper plate 4x into the rewiring pattern 4. The rewiring pattern 4 comprises the bump area 5a in which the bump 4a is provided and the wiring area 5b extending contiguously with the area 5a. The wiring area 5b of the rewiring pattern 4 is finished such that the area 5b is depressed toward the semiconductor wafer 30 in relation to the bump area 5a of the rewiring pattern 4, reflecting the concave shape of the upper shape of the copper plate 4x. The dummy bump 60 projects at a position different from the position of the electrode 2. In this embodiment, the dummy bump 60 is provided at a position corresponding to the pad electrode area 5c. Further, in this embodiment, the dummy bump 60 is provided at an end of the rewiring pattern opposite to the bump 4a.

Figure 19B:
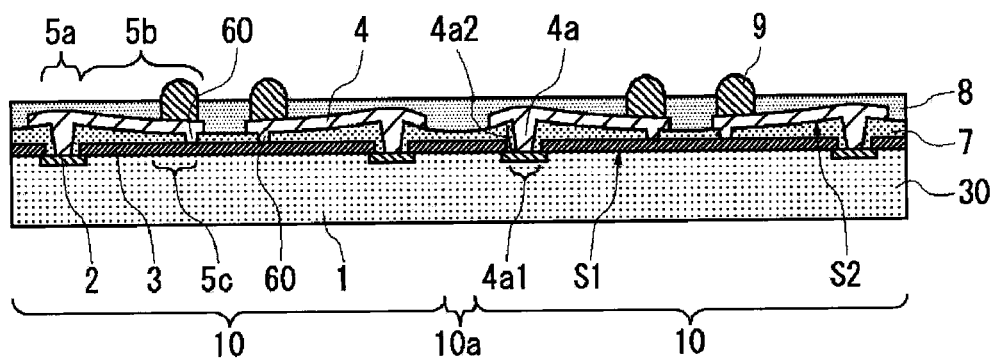

As shown in FIG. 19B, the solder resist layer 8 is formed so as to have an opening in the pad electrode area 5c of the rewiring pattern 4 and to cover the insulating layer 7 and the rewiring pattern 4. The solder resist layer 8 functions as a protective film for the rewiring pattern 4. The solder resist layer 8 comprises, for example, epoxy resin and has a thickness of about 40 μm. Solder printing is used to form an electrode for external connection (solder ball) 9 which functions as a terminal for the pad electrode area 5c of the rewiring pattern 4. More specifically, the electrode 9 is formed by printing solder paste (paste mixture of resin and solder) onto a desired location using a screen mask and heating the paste to a solder melting temperature. More specifically, the dummy bump 60 is formed on the surface S2 of the pad electrode area 5c of the rewiring pattern 4. The electrode 9 is formed on the surface opposite to the surface S2 of the rewiring pattern 4.

Figure 19C:
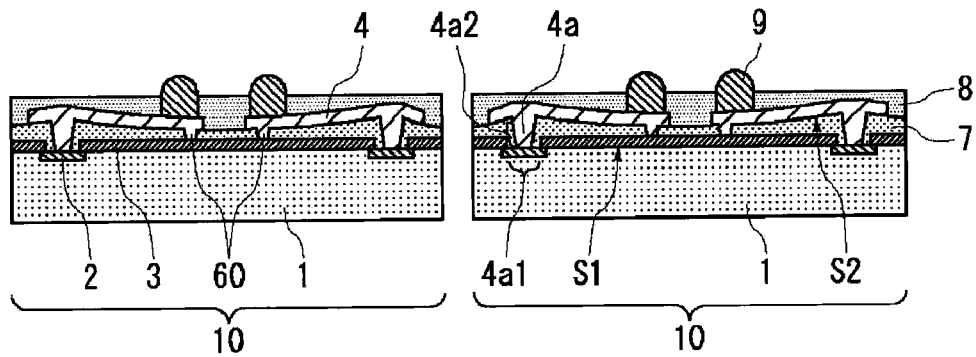

As shown in FIG. 19C, individual semiconductor modules are produced by dicing the semiconductor wafer 30 from beneath (underside) the wafer 30 along scribe lines 10a which define the plurality of semiconductor module areas 10 (semiconductor substrate 1). Residue created in the process of dicing is removed by cleaning the individual semiconductor modules by a chemical solution.

Through these steps, the semiconductor module according to the sixth embodiment shown in FIG. 16 is produced.

According to the semiconductor module and the manufacturing method of the sixth embodiment, the following advantages are provided in addition to the advantages of the first embodiment.

(12) Since the top of the dummy bump 60, provided on the surface S2 of the copper plate 4x, comes into contact with the protective film 3 in the press work, the copper plate 4x bent into a concave shape is supported by the dummy bump 60. Thus, since the height of the dummy bump 60 defines a distance between the copper plate 4x and the protective film 3, the concave shape or the degree of bending of the copper plate 4x can be adjusted by the dummy bump 60. Particularly, by providing the dummy bump 60 at an end of the rewiring pattern opposite to the bump 4a, the concave shape or the degree of bending of the rewiring pattern 4 can be adjusted.

(13) By forming the dummy bump 60 on the surface S2 of the pad electrode area 5c of the rewiring pattern 4, and by forming the electrode 9 on the surface opposite to the surface S2 of the rewiring pattern 4, the electrode 9 is supported by the dummy bump 60. Thereby, vertical displacement of the electrode 9 is less likely to occur so that connection reliability occurring when the electrode 9 is connected to a packaging substrate is improved.

(14) By providing the dummy bump 60 projecting from the rewiring pattern 4 into the insulating layer 7, the heat generated by the semiconductor substrate 1 is transferred to the rewiring pattern 4 via the dummy bump. Thus, heat resistance encountered as the heat from the semiconductor substrate 1 is transferred to the rewiring pattern 4 is less than when the dummy bump 60 is not provided, thereby improving the heat dissipation of the semiconductor module. As a result, increase in the temperature of the semiconductor module is limited, and the thermal stress generated between the rewiring pattern 4 and the insulating layer 7 is reduced so that the rewiring pattern 4 is prevented from peeling from the insulating layer 7.

The embodiments described so far are intended to be illustrative only and it will be obvious to those skilled in the art that various modifications such as design variations could be developed based upon the knowledge of a skilled person and that such modifications are also within the scope of the present invention. For example, the structures of the embodiments may be combined as appropriate.

In the first embodiment, in order to secure a large gap between the electrodes 2 on the semiconductor substrate 1, the copper plate 4x, the insulating layer 7, and the semiconductor substrate 1 are built one upon another such that the bumps 4a are embedded in the insulating layer 7. The rewiring pattern 4 is then formed and the electrode 9 is provided on the rewiring pattern 4. Alternatively, wiring layers having a predetermined pattern may be repeatedly formed by using copper plates having bumps, so as to build a multilayer structure. According to this approach, a multilayer wiring is easily built up, and connection reliability of the bumps in the multilayer wiring is improved.

In the second embodiment, the electrode 9 is provided on the exposed surface of the post 4c of the copper rewiring pattern 4, by way of example. Alternatively, a gold plating layer A (electrolytic Au/N plating film) may be formed using selective plating before forming the electrode 9. In this way, reliability of connection between the post and the electrode is improved.

In the fourth embodiment, the electrodes 2 connected to the integrated circuit constituting the semiconductor device, and the bumps 4a connected to the electrodes are provided at a plurality of locations. The rewiring pattern 4 (wiring area 5b1) connecting the bumps 4a is depressed toward the semiconductor substrate 1. Alternatively, a dummy electrode not connected to the integrated circuit may be employed as one of the electrodes 2 so that the rewiring pattern is depressed in an interval between the bump on the dummy electrode and the bump on the electrode 2. Still alternatively, a dummy bump not connected to the electrode 2 may be employed as one of the bumps 4a so that the upper surface of the rewiring pattern is depressed in an interval between the dummy bump and the bump. The aforementioned advantages are equally enjoyed in these cases. Provision of a dummy bump improves the flexibility of designing the layout of bumps. Accordingly, the amount of depression H4 of the upper surface of the rewiring pattern 4 is more easily controlled.

In the sixth embodiment, the overetching is performed to form the dummy bump 60 lower than the bump. Alternatively, the resist mask PR1 may be selectively removed, and a plating film having a thickness of, for example, 5 μm may be formed on top of the bump 4a, while the resist mask PR1' remains. In this way, it is ensured that the dummy bump 60 is lower than the bump 4a.

In the embodiments described above, the bump integral with the copper plate is formed as a truncated cone having a progressively smaller diameter (dimension) toward the end part thereof. Alternatively, the bump may be of a cylindrical shape having a predetermined diameter. While the bump with a truncated cone shape is used in the embodiments, the bump may have a polygonal (e.g. square) shape. By using these shapes, it is equally possible to reduce the stress applied to the bump in the direction of peeling so that the reliability of connection between the electrode of the semiconductor substrate and the bump can be improved.

In the embodiments described above, the flat insulating layer having a uniform thickness is used in the process of pressure-bonding the copper plate to the semiconductor wafer via the insulating layer. Alternatively, a depression may be formed in a part of the insulating layer corresponding to an area in which the rewiring pattern is to be depressed, by using lithographic and etching steps, so that the copper plate and the semiconductor wafer may be pressure-bonded via the insulating layer having the depression thus formed.

Seventh Embodiment

Figure 20:
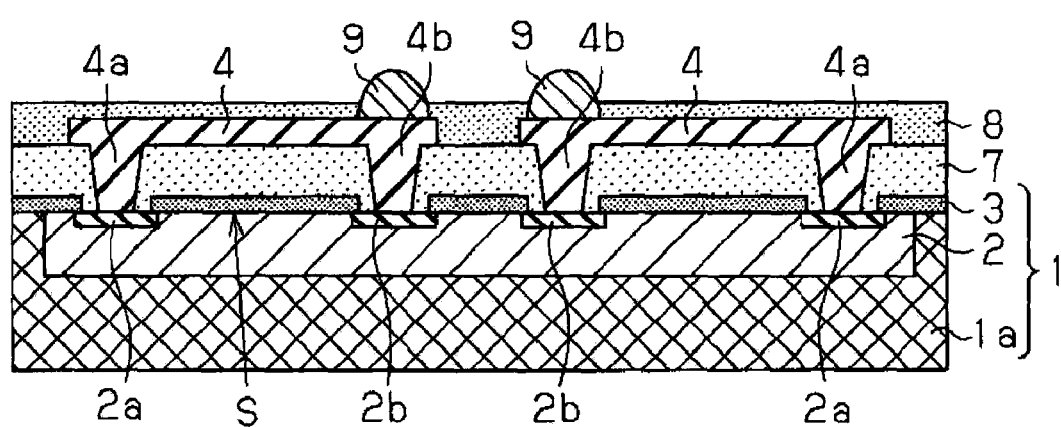
FIG. 20 is a schematic sectional view showing a semiconductor module according to a seventh embodiment.

FIG. 20 is a schematic sectional view showing a semiconductor module according to a seventh embodiment.

A p-type silicon substrate 1a is used as a base to form a semiconductor substrate 1 in the semiconductor module according to the seventh embodiment. A semiconductor device 2 such as an electric circuit is formed inside the semiconductor substrate 1 by using a well-known technology. A semiconductor device 2 (for example, LSI), an electrode 2a electrically connected to the semiconductor device 2, and a dummy electrode 2b not electrically connected to the semiconductor device 2 are formed on a surface S1 of the p-type silicon substrate 1a. An insulating protective film 3 for protecting the semiconductor device 2 is formed on the p-type silicon substrate 1a. A metal such as aluminum (Al) or copper (Cu) is used to form the electrode 2a and the dummy electrode 2b. The protective film 3 may be an insulating film such as a silicon oxide ($SiO_2$) film or a silicon nitride (SiN) film.

An insulating layer 7 is formed on the electrode 2a and the dummy electrode 2b, and a rewiring pattern 4 having a predetermined pattern is formed on the insulating layer 7. The rewiring pattern 4 is provided with a first conductor 4a formed to be integral with the rewiring pattern 4 and penetrating the insulating layer 7 so as to be in contact with the electrode 2a. A second conductor 4b integral with the pattern 4 and penetrating the insulating layer 7a so as to be in contact with the dummy electrode 2b is formed on the surface from which the first conductor 4a projects.

An electrode for external connection (solder ball) 9 is provided at a position on the upper surface (the surface opposite to the surface from which the first conductor 4a and the second conductor 4b project) of the rewiring pattern 4 overlapping the second conductor 4b. A solder resist layer 8 is provided to cover the insulating layer 7 and the rewiring pattern 4 on the semiconductor substrate. The electrode 9 projects upward from the solder resist layer 8.

The semiconductor substrate 1 is an example of the "substrate" according to the invention, the semiconductor device 2 is an example of the "semiconductor device" according to the invention, the electrode 2a is an example of the "first electrode" according to the invention, the dummy electrode 2b is an example of the "second electrode" according to the invention, the first conductor 4a is an example of the "first conductor" according to the invention, the second conductor 4b is an example of the "second conductor", the insulating layer 7 is an example of the "insulating layer" according to the invention, the rewiring pattern 4 is an example of the "wiring layer" according to the invention, and the electrode 9 is an example of the "electrode for external connection".

(Manufacturing Method)

FIG. 21 is a sectional view showing how a copper plate having the conductors is formed.

Figure 21A:
FIGS. 21A-21E are schematic sectional views showing how a copper plate having conductors (bumps) is formed according to the seventh embodiment.

As shown in FIG. 21A, a conductor (e.g., a copper plate 4z) thicker than the sum of the height of the first conductor 4a (or the second conductor 4b) and the thickness of the rewiring pattern 4 is prepared. It will be assumed here that the thickness of the copper plate 4z is about 300 µm.

A rolled metal comprising rolled copper is used to form the copper plate 4z. As compared with a metal film comprising copper and formed by, for example, plating, a rolled metal comprising copper excels in mechanical strength and is suitable as a material for rewiring.

Figure 21B:
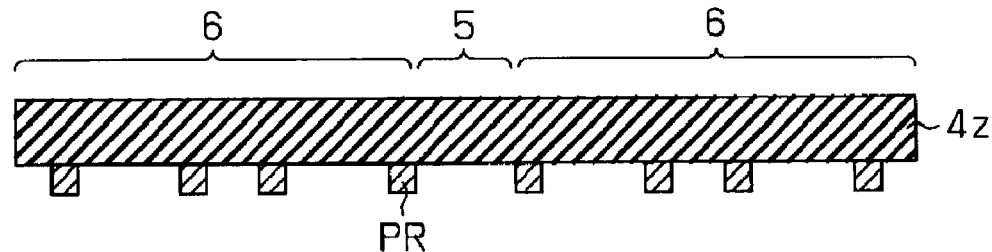

As shown in FIG. 21B, lithographic steps are used to form resist masks PR in areas for conductors within each of the semiconductor module areas 6. The areas for conductors are arranged to correspond to the positions of the electrodes (the electrodes 2a and the dummy electrodes 2b) of the semiconductor substrate 1.

Figure 21C:
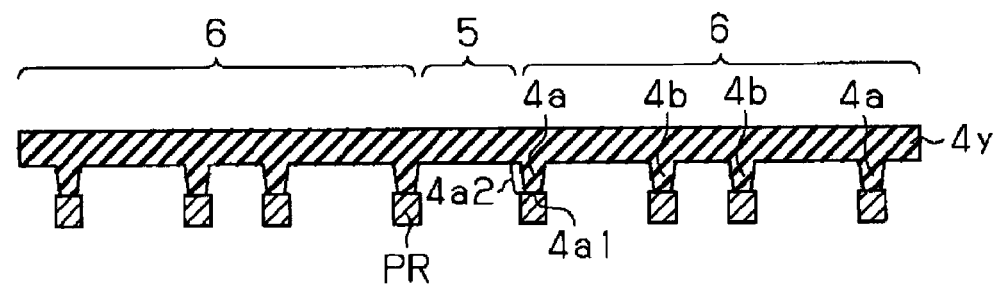

As shown in FIG. 21C, wet etching using a chemical solution is performed by using the resist masks PR as a mask so as to work the copper plate 4z. In this way, the first conductors 4a and the second conductors 4b projecting from the lower surface of a copper plate 4y are formed in a single step. The first conductor 4a is formed as a truncated cone. More specifically, the conductor 4a is provided with an end part 4a1 parallel with the contact surface of the electrode 2a of the semiconductor substrate 1, and with a side part 4a2 formed to be progressively smaller in diameter (dimension) toward the end part 4a1. The conductor 4a has a trapezoidal cross section, as a result of the end of a cone being removed. The height of the first conductor 4a is about 35 µm. The diameter of the first conductor 4a at the end (end part 4a1) and the diameter at the base (the part connected to the copper plate) are about 30 µmφ and 40 µmφ, respectively. In this embodiment, the second conductor 4b is similarly worked into the truncated cone shape as the first conductor 4a.

Figure 21D:
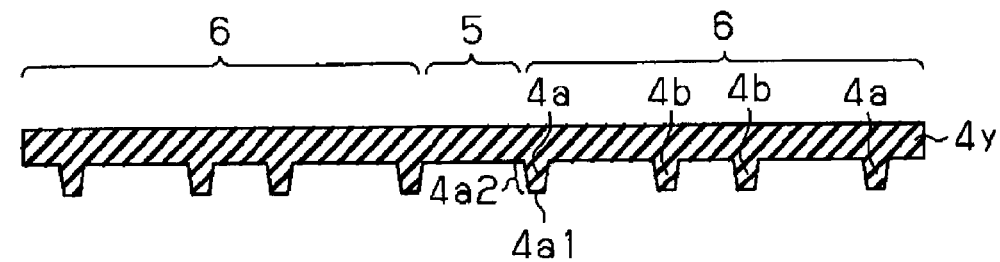

As shown in FIG. 21D, the resist masks PR are removed. With this, the first conductor 4a and the second conductor 4b are formed on one surface (lower surface) of the copper plate 4y so as to be integral with the plate.

Figure 21E:
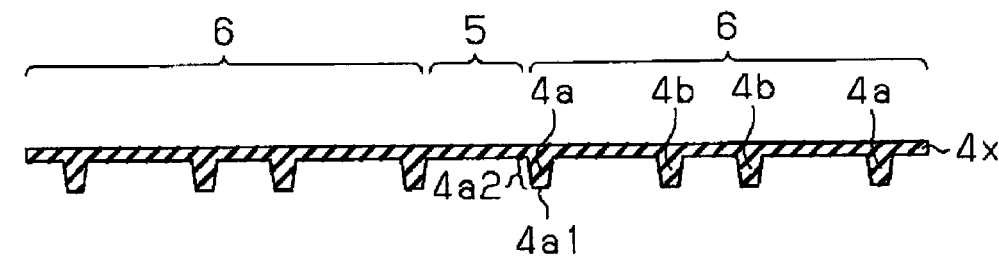

As shown in FIG. 21E, the thickness of the copper plate 4y is reduced by, for example, wet etching the entirety of the copper plate 4y from the side upper surface (the surface opposite to the surface from which the conductors project), using a chemical solution. In this way, a copper plate 4x, worked to a desired thickness (the thickness of the rewiring pattern 4) and integrally provided with the first conductors 4a and the second conductors 4b on the one surface (lower surface), is formed. The thickness of the copper plate 4x according to the embodiment is about 20 µm. The copper plate 4x is an example of the "metal plate" according to the invention.

The copper plate 4x, thus manufactured to have the first conductors 4a and the second conductors 4b, is used in the process described below of manufacturing the semiconductor module according to the seventh embodiment. FIGS. 22A through 23B are sectional views showing the process of manufacturing the semiconductor module according to the seventh embodiment.

Figure 22A:
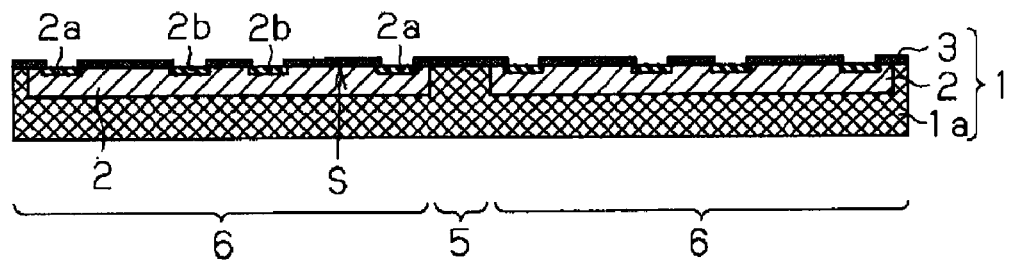
FIGS. 22A-22D are sectional views showing the process of manufacturing the semiconductor module according to the seventh embodiment.

Then, as shown in FIG. 22A, the semiconductor substrate 1, provided with a plurality of semiconductor module areas 6 defined in the p-silicon substrate 1a by scribe lines 5, is prepared. On the surface S of the semiconductor substrate 1 are formed the semiconductor device 2, the electrode 2a, the dummy electrode 2b, and the protective film 3 in each of the semiconductor module areas 6. The semiconductor substrate 1 as described is produced by a semiconductor manufacturing process involving a combination of related-art lithographic technology, etching technology, ion implantation technology, film deposition technology, and thermal process technology, and the like.

Figure 22B:
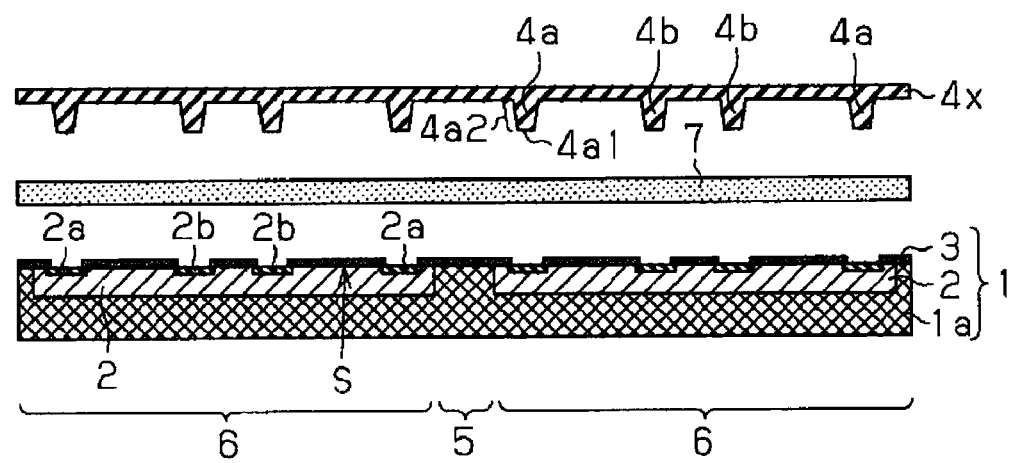

As shown in FIG. 22B, the semiconductor substrate 1 and the copper plate 4x integrally formed with the first conductors 4a and the second conductors 4b are placed so as to sandwich the insulating layer 7. The thickness of the insulating layer 7 is about 35 µm, which is substantially equal to the height of the first conductor 4a and the second conductor 4b. Preferably, the insulating layer 7 is formed of a material that undergoes plastic flow when applied pressure. Epoxy thermosetting resin will be mentioned as such a material. The copper plate 4x having the first conductors 4a and the second conductors 4b is formed as described above.

Figure 22C:
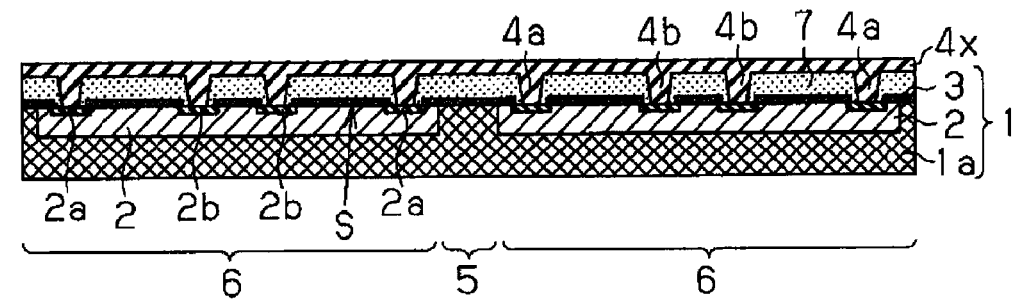

As shown in FIG. 22C, the semiconductor substrate 1, the insulating layer 7, and the copper plate 4x are integrated by pressure molding the sandwiched assembly as described above by a press machine. The pressure and the temperature of the press work are about 5 MPa and 200° C., respectively. The press work lowers the viscosity of the insulating layer 7 so that the insulating layer 7 undergoes plastic flow. This allows the first conductor 4a to penetrate the insulating layer 7 so that the first conductor 4a and the electrode 2a are electrically connected. Further, the second conductor 4b is allowed to penetrate the insulating layer 7 so that the second conductor 4b and the electrode 2b are electrically connected. Since the first conductor 4a has the side part 4a2 formed to be progressively smaller in diameter (dimension) toward the end part 4a1, the first conductor 4a penetrates the insulating layer 7 smoothly. As a result, the insulating layer 7 is effectively drained out from the interface between the first conductor 4a and the electrode 2a, preventing a portion of the insulating layer 7 from remaining as the residue.

Figure 22D:
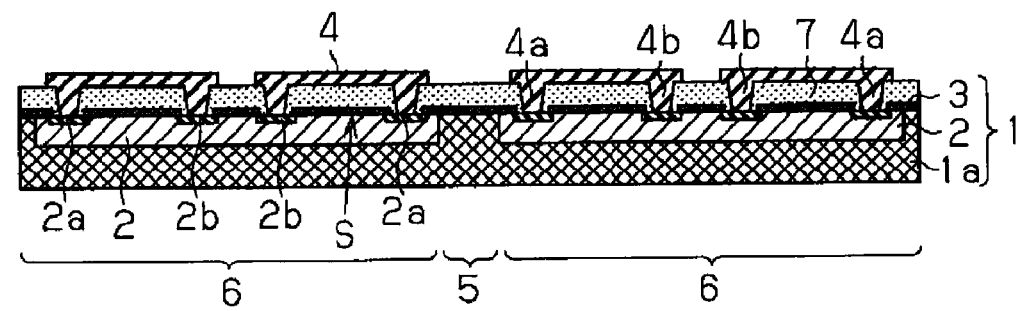

As shown in FIG. 22D, lithography and etching are used to work the copper plate 4x into the rewiring pattern 4 having a predetermined pattern.

Figure 23A:
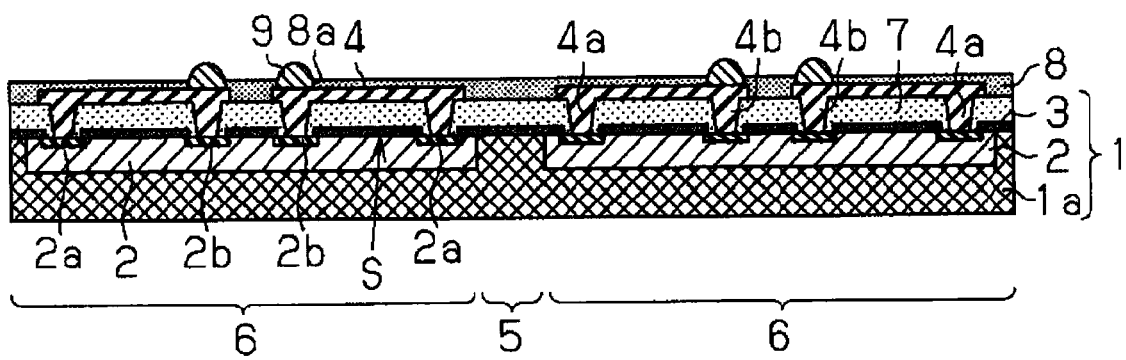
FIGS. 23A-23B are sectional views showing the process of manufacturing the semiconductor module according to the seventh embodiment.

Then, as shown in FIG. 23A, the solder resist layer 8 is formed so as to cover the insulating layer 7 and the rewiring pattern 4 provided on the semiconductor substrate 1. The solder resist layer 8 functions as a protective film for the rewiring pattern 4. The solder resist layer 8 comprises, for example, epoxy resin and has a thickness of about 40 μm. An opening 8a in the solder resist layer 8 is formed in the electrode area on the rewiring pattern 4.

Solder printing is then used to form the electrode (solder ball) 9 which functions as a terminal for external connection on the rewiring pattern 4 exposed through the opening 8a of the solder resist layer 8. More specifically, the electrode 9 is formed by printing solder paste (paste mixture of resin and solder) onto a desired location using a screen mask and heating the paste to a solder melting temperature.

Figure 23B:
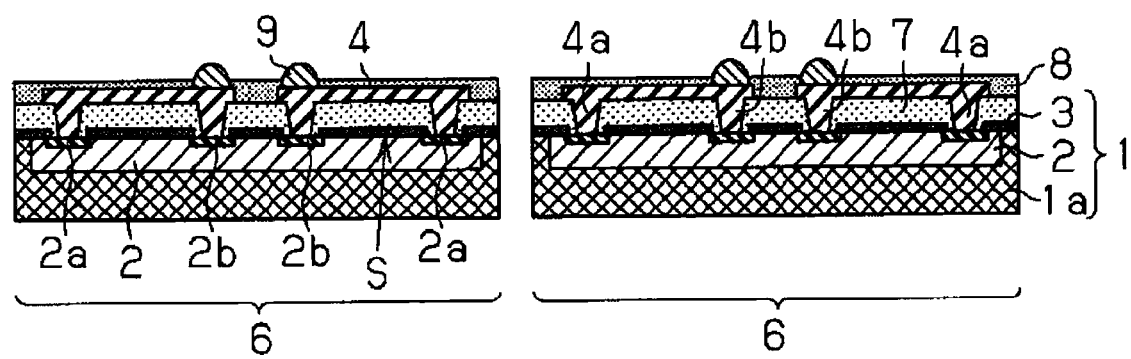

As shown in FIG. 23B, individual semiconductor substrates 1 are produced by dicing along the scribe lines 5 which define the plurality of semiconductor module areas 6. Residue created in the process of dicing is then removed by cleaning using a chemical solution.

Through these steps, the semiconductor module according to the seventh embodiment shown in FIG. 20 is produced.

According to the semiconductor module and the manufacturing method of the seventh embodiment, the following advantages are provided.

(15) By providing the second conductor 4b projecting from the rewiring pattern 4 into the insulating layer 7, the area of contact between the rewiring pattern 4 and the insulating layer 7 is increased, and the anchor effect of the second conductor 4b improves the closeness of contact at the interface (contact surface) between the rewiring pattern 4 and the insulating layer 7. Accordingly, the rewiring pattern 4 is prevented from peeling from the insulating layer 7 due to thermal stress generated while the semiconductor module is in operation.

(16) By providing the second conductor 4b projecting from the rewiring pattern 4 into the insulating layer 7, the heat generated by the semiconductor substrate 1 is transferred to the rewiring pattern 4 via the second conductor 4b. Thus, heat resistance is reduced in a path in which the heat from the semiconductor substrate 1 is transferred to the rewiring pattern 4, thereby improving the heat dissipation of the semiconductor module. As a result, increase in the temperature of the semiconductor module is limited, and the thermal stress generated between the rewiring pattern 4 and the insulating layer 7 is reduced so that the rewiring pattern 4 is prevented from peeling from the insulating layer 7.

(17) By ensuring that the second conductor 4b is in contact with the semiconductor substrate 1, the heat generated from the semiconductor substrate 1 during the operation is easily transferred to the rewiring pattern 4 via the second conductor 4b. Accordingly, the advantage of (16) is more readily appreciated.

(18) By providing the electrode 9 at a position on the rewiring pattern 4 overlapping the second conductor 4b, the heat generated from the semiconductor substrate 1 during the operation is efficiently discharged outside via the second conductor 4b and the rewiring pattern 4. Accordingly, the advantage of (16) or (17) is more readily appreciated.

(19) By ensuring that the end of the second conductor 4b is in contact with the dummy electrode 2b provided in the semiconductor substrate 1, intimate contact between metals occurs at the contact surface. Thus, since the difference in coefficient of thermal expansion between the second conductor 4b and the dummy electrode 2b is small, more intimate contact at the end is ensured than when the end of the second conductor 4b is in contact with an insulating resin material, even when the temperature of the semiconductor module is increased. As a result, the intimacy of contact between the rewiring pattern 4 and the insulating layer 7 is further improved.

(20) By forming the second conductor 4b and the dummy electrode 2b of the same metal (e.g., copper), it is ensured that the coefficient of thermal expansion of the second conductor 4b and that of the dummy electrode 2b are identical. Accordingly, the advantage of (19) is more readily appreciated.

(21) By forming the exposed surface of the dummy electrode 2b of gold (Au) and plating the end of the second conductor 4b with gold (Au), Al—Au alloy is formed after subjecting an assembly of the electrode 2b and the conductor 4b in contact with each other to a thermal treatment. Therefore, the intimacy of contact between the dummy electrode 2b and the second conductor 4b is further improved.

(22) Since the formation and embedding of the second conductor 4b is performed in the same process of forming and pressure-bonding the first conductor 4a, a semiconductor module with improved intimacy of contact between the rewiring pattern 4 and the insulating layer 7 is manufactured at a lower cost than when additionally performing the process for improving intimacy of contact by related-art means such as treatment with a chemical solution or plasma treatment.

(23) By forming the second conductor 4b so as not to extend outside the rewiring pattern 4, the second conductor 4b can be provided without changing the layout of the rewiring pattern 4.

(24) By providing the second conductor 4b, the bending of the copper plate 4x (the rewiring pattern 4 produced after the press work) occurring in the press work is optimally adjusted. Thus, the rewiring pattern 4 can be patterned even more precisely and finely.

Eighth Embodiment

Figure 24:
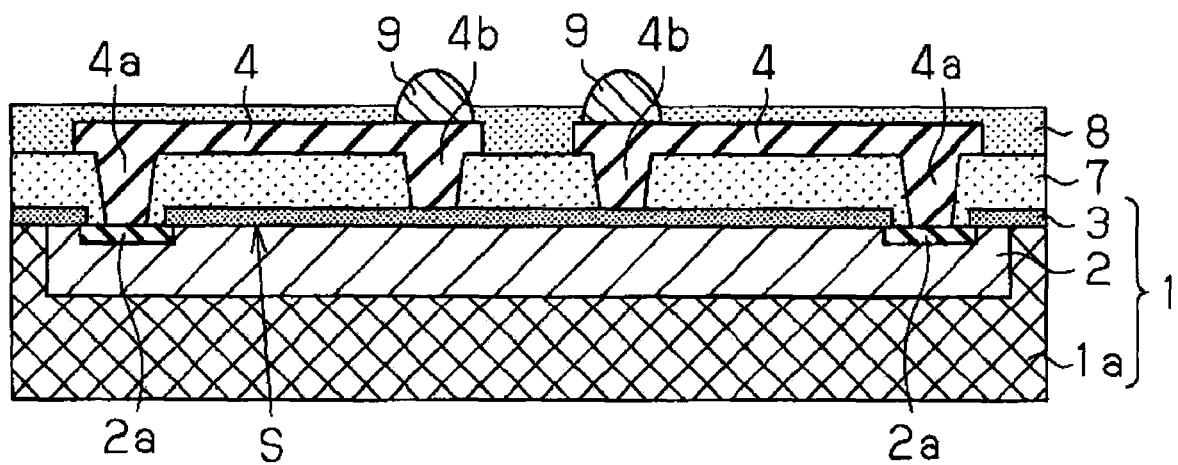
FIG. 24 is a schematic sectional view showing a semiconductor module according to an eighth embodiment.

FIG. 24 is a schematic sectional view showing a semiconductor module according to an eighth embodiment. The difference from the seventh embodiment is that the dummy electrodes 2b are not provided on the semiconductor substrate 1, and the second conductors 4 are formed to be in contact with the protective film 3 of the semiconductor substrate 1. The other aspects of the eighth embodiment are the same as the corresponding aspects of the seventh embodiment.

According to the semiconductor module and the manufacturing method of the eighth embodiment, the following advantages are provided in addition to the advantages (15)-(18) and (22)-(24) discussed above.

(25) Since the dummy electrode 2b is not provided in the semiconductor substrate 1, the flexibility in the layout of the rewiring pattern 4 and the second conductor 4b with respect to the separately prepared semiconductor substrate is improved. Accordingly, the cost of manufacturing the semiconductor module is reduced.

(26) The intimacy of contact between the rewiring pattern 4 and the insulating layer 7 is improved merely by modifying the process such that the second conductors 4b are formed in the process of forming the first conductors 4a in the copper plate 4x. Accordingly, the suitable semiconductor module as discussed above in (15)-(18) is easily manufactured.

Ninth Embodiment

Figure 25:
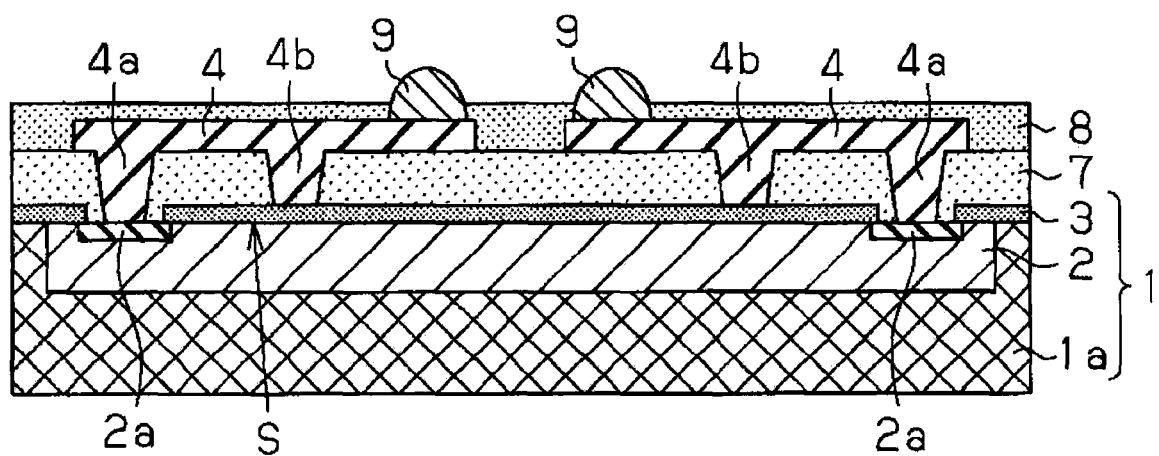
FIG. 25 is a schematic sectional view showing a semiconductor module according to a ninth embodiment.

FIG. 25 is a schematic sectional view showing a semiconductor module according to a ninth embodiment. The difference from the eighth embodiment is that the second conductor 4b, which is provided immediately below the electrode 9 in the eighth embodiment, is provided between the first conductor 4a and the electrode 9. The other aspects of the second embodiment are the same as the corresponding aspects of the eighth embodiment.

According to the semiconductor module and the manufacturing method of the ninth embodiment, the following advantages are provided in addition to the advantages (15)-(18) and (22)-(24) discussed above.

(27) Since the second conductor 4b is provided between the first conductor 4a and the electrode 9, the flexibility in the layout of the second conductor 4b is improved. Therefore, the second conductors 4b can be provided in more advantageous rewiring pattern portions on the semiconductor substrate 1 so that the heat generated from the semiconductor substrate 1 during the operation is more efficiently transferred to the rewiring pattern 4. Accordingly, the advantage of (16) or (17) is more readily appreciated.

(28) By forming the second conductor 4b so as not to extend outside the rewiring pattern 4, the second conductor 4b can be provided without changing the layout of the rewiring pattern 4. Accordingly, the flexibility of the layout of the second conductors 4b is further improved.

A description will be given of a mobile device provided with the inventive semiconductor module. Although a cell phone is illustrated by way of example, the mobile device may be an electronic device such as a personal digital assistant (PDA), a digital video camera (DVC), a music player, and a digital still camera (DSC).

Figure 26:
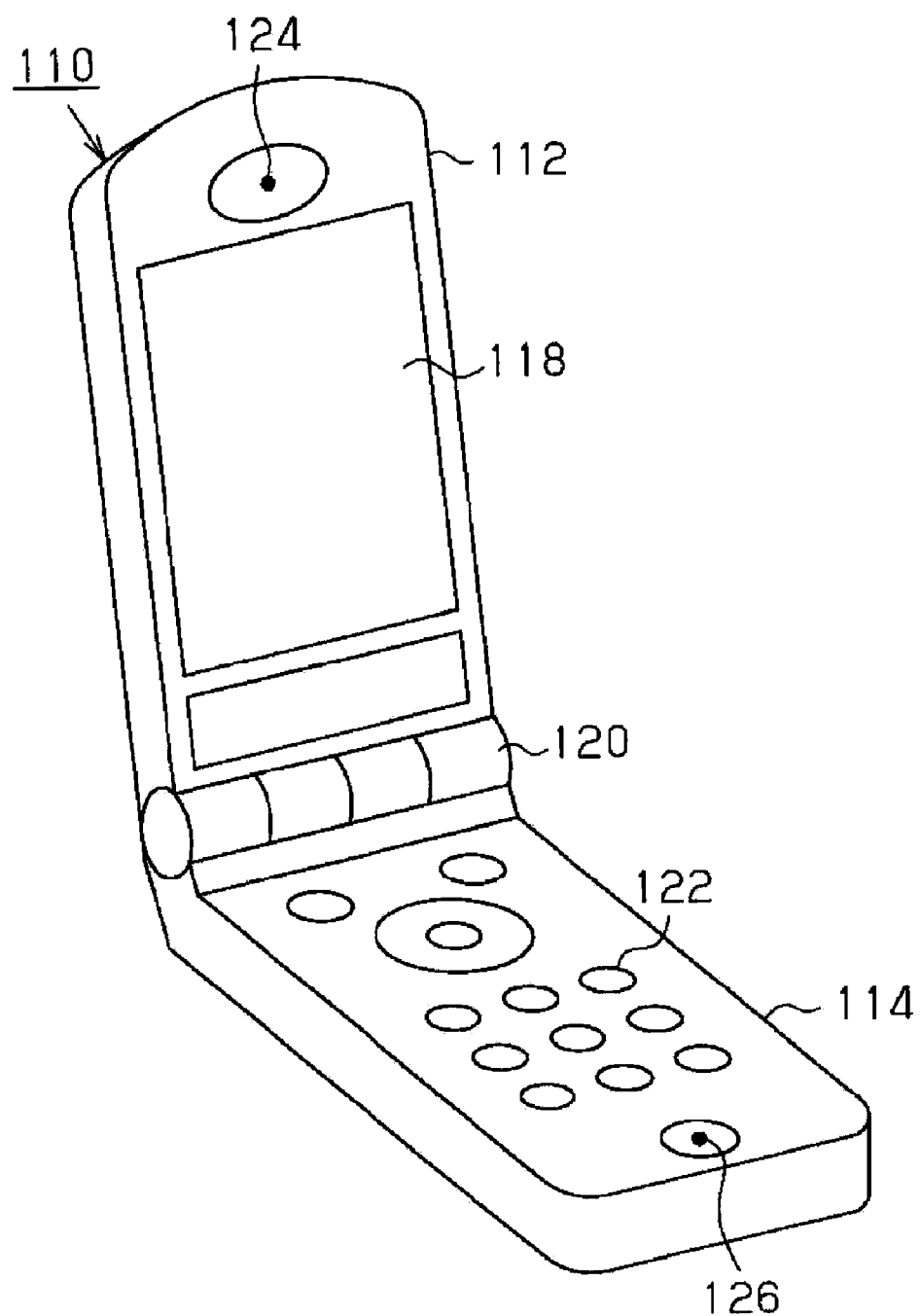
FIG. 26 is a schematic view of a mobile device provided with the semiconductor module according to the present invention.

FIG. 26 shows the structure of a cell phone provided with the semiconductor module according to any one of the embodiments of the present invention. A cell phone 110 is of a structure in which a first casing 112 and a second casing 114 are connected to each other via a movable part 120. The first casing 112 and the second casing 114 are rotatable around the movable part 120. The first casing 112 is provided with a display unit 118 for displaying information such as characters and images, and with a speaker unit 124. The second casing 114 is provided with a control 122 such as control buttons, and with a microphone 126. The semiconductor module according to the embodiment of the present invention is built inside the cell phone 110. The inventive semiconductor module built in the cell phone may be employed as a power supply circuit for driving the circuits, an RF generator circuit for generating radio frequency, a digital-to-analog converter (DAC), an encoder circuit, or a circuit for driving the backlight of a liquid crystal panel employed in the display unit of the cell phone.

Figure 27:
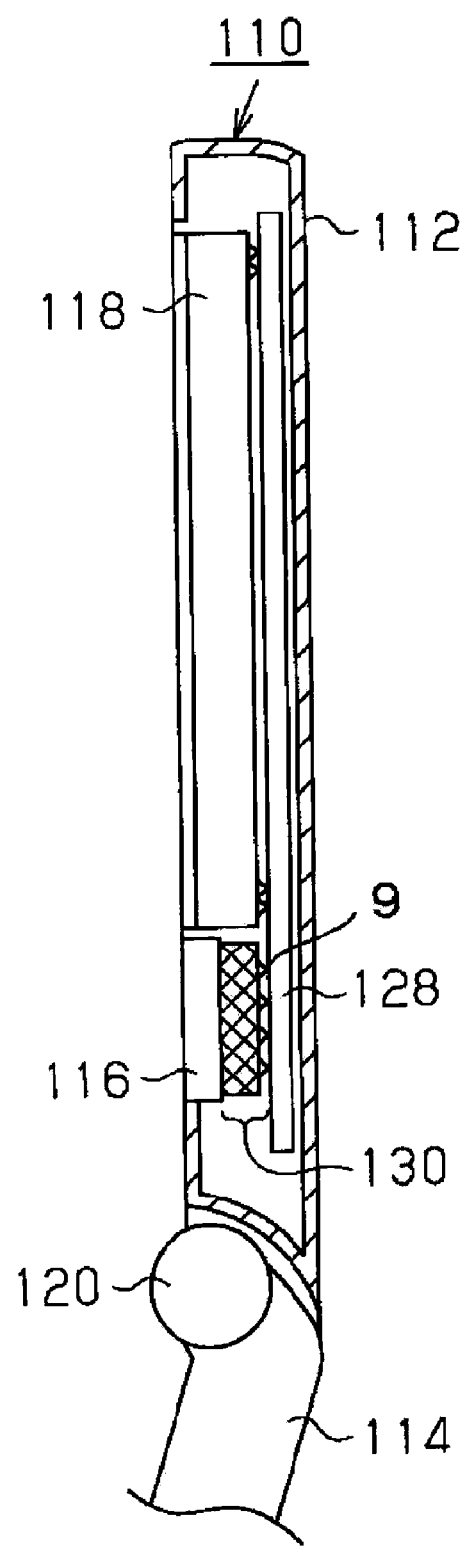
FIG. 27 is a schematic sectional view of a mobile device provided with the semiconductor module according to the present invention.

FIG. 27 is a partial sectional view of the cell phone shown in FIG. 26 (a sectional view of the first casing 112). The semiconductor module 130 according to the embodiment of the present invention is mounted on a printed board 128 via the electrode 9, and is electrically connected to the display unit 118, etc., via the printed board 128. A heat dissipating substrate 116 embodied by, for example, a metal plate is provided on the back surface (the surface opposite to the electrode 9) of the semiconductor module 130. The heat generated by, for example, the semiconductor module 130 is prevented from being contained inside the first casing 112 and is efficiently discharged outside of the first casing 112.

The mobile device provided with the semiconductor module according to the embodiment of the present invention provides the following advantages.

(29) In case the semiconductor module according to any one of the first through sixth embodiments is used:

The stress, applied to the bump 4a in the direction of peeling (in the direction in which the bump is removed from the substrate) in the presence of the thermal stress generated while the semiconductor module 130 is in operation, is reduced so that the reliability of connection between the electrode and the bump in the semiconductor module is improved. Accordingly, the reliability (thermal reliability) of the mobile device carrying the semiconductor module 130 is improved.

(30) In case the semiconductor module according to any one of the seventh through ninth embodiments is used:

The rewiring pattern 4 is prevented from peeling from the insulating layer 7 due to the thermal stress generated while the semiconductor module 130 is in operation so that the reliability of the semiconductor module 130 is improved. Accordingly, the reliability (thermal reliability) of the mobile device carrying the semiconductor module 130 is improved.

(31) Since the heat from the semiconductor module 130 is efficiently discharged outside via the heat dissipating substrate 116, increase in the temperature of the semiconductor module 130 is limited so that the thermal stress generated between the rewiring pattern 4 and the insulating layer 7 is reduced. Accordingly, the reliability of connection between the electrode and the bump is higher than when the heat dissipating substrate 116 is not provided, or the rewiring pattern in the semiconductor module is prevented from peeling from the insulating layer 7, so that the reliability (thermal reliability) of the semiconductor module 130 is improved. Consequently, the reliability (thermal reliability) of the mobile device is improved.

(32) Since the semiconductor module 130 manufactured by the wafer level chip size package (CSP) process illustrated in the embodiments is thin and small-sized, the mobile device carrying the semiconductor module 130 is thin and small-sized accordingly.

The seventh and subsequent embodiments described are intended to be illustrative only and it will be obvious to those skilled in the art that various modifications such as design variations could be developed based upon the knowledge of a skilled person and that such modifications are also within the scope of the present invention. For example, the structures of the embodiments may be combined as appropriate.

In the embodiments described above, the conductor integral with the copper plate is formed as a truncated cone having a progressively smaller diameter toward the end part thereof. The conductor may be shaped otherwise. For example, the conductor may be of a cylindrical shape having a predetermined diameter. While the conductor with a truncated cone shape is used in the embodiments, the conductor may have a polygonal (e.g. square) shape. The advantages described above are equally enjoyed in these cases.

In the embodiments, the first conductor 4a and the second conductor 4b have the same shape and size, by way of example. Alternatively, the conductors may have different shapes and sizes.

In the embodiments, a single second conductor 4b is provided for each of the rewiring patterns 4 for routing the electrode 2a. The number of electrodes 2a may be otherwise. For example, a plurality of second conductors 4b may be provided at respective (two or more) locations in the pattern. The intimacy of contact at the interface (contact surface) between the rewiring pattern 4 and the insulating layer 7 is further improved by the presence of the additional second conductors 4b.

In the embodiments, the copper plate 4x, the insulating layer 7, and the semiconductor substrate 1 are built one upon another such that the first conductors 4a and the second conductors 4b are embedded in the insulating layer 7. The rewiring pattern 4 is then formed and the electrodes 9 are provided on the rewiring pattern 4. Alternatively, wiring layers having a predetermined pattern may be repeatedly formed by using copper plates having conductors (the first conductors electrically connected to the wiring layer below and the second conductors not connected to the wiring layer below), so as to build a multilayer structure. According to this approach, a multilayer wiring is easily built up, and the intimacy of contact (thermal reliability) of the wiring layers in the multilayer wiring is improved.

What is claimed is:

1. A semiconductor module comprising:
   a substrate having an electrode on a surface;
   an insulating layer on the substrate;
   a wiring layer having a uniform thickness on the insulating layer; and
   a bump provided with the wiring layer as one body, the bump projecting from the wiring layer of uniform thickness and being electrically connected to the electrode by penetrating the insulating layer, wherein
   the wiring layer has a first area in which the bump is provided, and a second area extending contiguously with the first area,
   the second area of the wiring layer is depressed toward the substrate with respect to the first area, and
   a part of the wiring layer is on a concave upper surface of the insulating layer.

2. The semiconductor module according to claim 1,
   further comprising a plurality of additional bumps provided with the wiring layer, the additional bumps being formed integrally with the wiring layer as one body, wherein the concave upper surface of the insulating layer is between the bumps.

3. The semiconductor module according to claim 1, further comprising:
   an external connection electrode on a first side of the wiring layer, the first side being opposite to a second side of the wiring layer from which the bump projects, wherein the external connection electrode does not overlap the bump; and
   a covering layer that covers areas of the wiring layer outside of a region of the wiring layer in which the external connection electrode is located.

* * * * *